US012764867B2

(12) United States Patent
Taylor et al.

(10) Patent No.: US 12,764,867 B2
(45) Date of Patent: Oct. 13, 2026

(54) SUBSTRATE WITH EMBEDDED CONDUCTIVE COIN

(71) Applicant: Microchip Technology Caldicot Limited, Caldicot Monmouthshire (GB)

(72) Inventors: George Taylor, Wales (GB); Stylianos Syrigos, Newport (GB)

(73) Assignee: Microchip Technology Caldicot Limited, Caldicot Monmouth (GB)

( * ) Notice: Subject to any disclaimer, the term of this patent is extended or adjusted under 35 U.S.C. 154(b) by 386 days.

(21) Appl. No.: 18/488,201

(22) Filed: Oct. 17, 2023

(65) Prior Publication Data

US 2025/0016929 A1 Jan. 9, 2025

Related U.S. Application Data

(60) Provisional application No. 63/512,293, filed on Jul. 7, 2023.

(51) Int. Cl.
*H05K 1/183* (2026.01)
*H05K 1/185* (2026.01)

(52) U.S. Cl.
CPC ............ *H05K 1/183* (2013.01); *H05K 1/186* (2013.01); *H05K 2201/0355* (2013.01)

(58) Field of Classification Search
CPC .............................. H05K 1/183; H05K 1/186
See application file for complete search history.

(56) References Cited

U.S. PATENT DOCUMENTS

| | | | | |
|---|---|---|---|---|
| 9,661,738 | B1 * | 5/2017 | Jacobsson | H05K 1/0206 |
| 2016/0021753 | A1 | 1/2016 | Tomikawa et al. | 361/761 |
| 2018/0233429 | A1 | 8/2018 | Yosui et al. | |
| 2020/0312737 | A1 * | 10/2020 | Stahr | H10W 40/22 |
| 2022/0030720 | A1 | 1/2022 | Wei et al. | |
| 2024/0014142 | A1 * | 1/2024 | Morianz | H05K 1/185 |

FOREIGN PATENT DOCUMENTS

| | | | |
|---|---|---|---|
| EP | 3996473 A1 | 5/2022 | H05K 1/02 |

OTHER PUBLICATIONS

International Search Report and Written Opinion, Application No. PCT/EP2024/050303, 14 pages, Apr. 12, 2024.

* cited by examiner

*Primary Examiner* — Nathan Milakovich
(74) *Attorney, Agent, or Firm* — SLAYDEN GRUBERT BEARD PLLC

(57) ABSTRACT

A substrate (e.g., a printed circuit board) for use in an integrated circuit package includes a first dielectric layer, a conductive coin embedded in the first dielectric layer, a first conductive layer formed on a first side of the first dielectric layer, a cavity in the first conductive layer, the cavity located over the conductive coin, and an embedded circuit component arranged in the cavity in the first conductive layer, wherein the embedded circuit component is located over the conductive coin and conductively coupled to the conductive coin. The substrate also includes a second dielectric layer formed over the first conductive layer, a second conductive layer formed over the second dielectric layer, and a via extending through the second dielectric layer, the via electrically connecting the second conductive layer to the embedded circuit component.

28 Claims, 19 Drawing Sheets

SUBSTRATE WITH EMBEDDED CONDUCTIVE COIN

RELATED PATENT APPLICATION

This application claims priority to commonly owned U.S. Provisional Patent Application No. 63/512,293 filed Jul. 7, 2023, the entire contents of which are hereby incorporated by reference for all purposes.

TECHNICAL FIELD

The present disclosure relates to embedded component packaging of integrated circuit (IC) devices, and more particularly to a substrate (e.g., a PCB) with an embedded conductive coin.

BACKGROUND

Embedded component packaging refers to the concept of embedding various circuit components in the substrate (e.g., PCB) of an integrated circuit (IC) package, e.g., as opposed to mounting such circuit components on a top or bottom surface of the substrate. Such embedded circuit components may include IC dies (e.g., a processor or microcontroller die), transistors, resistors, or other active and/or passive components of an electric circuit. A substrate, e.g., PCB, with embedded circuit component(s) may be referred to as an "embedded component substrate." Embedded component substrates may provide various benefits, for example increasing the miniaturization of the substrate (thereby reducing the size of the IC package), protecting the embedded components, and/or reducing connection distances between respective components of the IC package.

However, the use of embedded component packaging (i.e., utilizing embedded component substrates) has largely been limited to low power applications, for example due to challenges with thermal management. In conventional designs, dissipated power is often managed using thermal vias or solid copper masses prefabricated (pre-attached) with embedded circuit components prior to embedding in the substrate.

There is a need for improved embedded component packaging structures and methods, for example embedded component substrates providing improved thermal management, improved electrical connection, reduced size, and/or simplified manufacturing processes, as compared with conventional structures and methods.

SUMMARY

Examples of the present disclosure provide embedded component substrates (e.g., PCBs) for use in IC packages (i.e., embedded component packaging) including at least one conductive coin (e.g., copper coin) embedded in the substrate core, and an embedded circuit component (e.g., a die) mounted directly or indirectly on the conductive coin.

By incorporating a conductive coin in the initial substrate core (e.g., starter core), embedded circuit components may can be mounted directly or indirectly to the conductive coin and embedded in further substrate layers (thereby defining embedded circuit components). Embedding a conductive coin in the initial starter core as a "through coin" (i.e., wherein the conductive coin may be conductively contacted from both opposing sides of the starter core) may eliminate a need for additional vias to connect the conductive coin to adjacent conductive layers (e.g., copper layer) above and below the coin, thereby fully utilising the starter core.

As used herein, a "coin" refers to a discrete mass for conducting thermal energy and/or electrical signals in an embedded component substrate. The coin (discrete mass) may be pre-fabricated and integrated into the embedded component substrate during construction of the embedded component substrate (e.g., wherein the pre-fabricated cion is inserted in an opening in a starter core dielectric, or mounted on a respective layer of the substrate).

In some examples, the coin may be formed as a solid mass of metal (e.g., copper), wherein the coin is both thermally and electrically conductive through the vertical thickness of the coin (i.e., from a top surface of the coin to a bottom surface of the coin), to thereby allow transmission of thermal energy (heat) and electrical signals through the vertical thickness of the coin. In examples in which such coin (formed as a solid metal mass) is physically arranged between an embedded circuit component and a respective conductive layer on opposing (e.g., top and bottom) sides of the coin, the coin may allow (a) heat transfer from the embedded circuit component to the respective conductive layer and (b) communication of electrical signals between the embedded circuit and the respective conductive layer.

In other examples, the coin may include at least one dielectric component, e.g., a ceramic disk or layer. The dielectric component may be formed between a pair of metal components, with the dielectric component being sandwiched between the pair of metal components. For example, the coin may be formed as (a) a metal-dielectric-metal stack structure (e.g., a copper-ceramic-copper stack structure) or (b) a metal mass laminated with a dielectric layer on one side and covered by a metal film such that the dielectric layer is sandwiched between the metal mass and the metal film (e.g., a copper mass laminated with an organic dielectric layer covered by a copper film). In such example, the coin may be thermally conductive, but not electrically conductive, through the vertical thickness of the coin, i.e., from a top surface of the coin to a bottom surface of the coin. Accordingly, in examples in which such coin (including at least one dielectric component) is physically arranged between an embedded circuit component and a respective conductive layer on opposing sides (e.g., top and bottom sides) of the coin, the coin may allow (a) heat transfer from the embedded circuit component to the respective conductive layer and (b) communication of electrical signals between the embedded circuit and the respective conductive layer.

In some examples, an embedded circuit component (e.g., die) is mounted in a cavity defined in a first conductive layer (and mounted directly or indirectly to an underlying conductive coin), wherein a top surface of the mounted embedded circuit component is flush (co-planar) or substantially flush with a top surface of a conductive layer outside the cavity. As a result, a dielectric layer formed over the conductive layer may have a substantially uniform thickness at locations over the embedded circuit component and locations laterally away from the embedded circuit component, so that an overlying second conductive layer may be connected both to the embedded circuit component and to the first conductive layer through the substantially uniform thickness dielectric layer using vias of similar size (e.g., micro-vias), which may be formed concurrently in a common process.

It should be understood that ordinal numbers used herein to identify respective elements (e.g., "first" dielectric layer, "second" dielectric layer, "first" conductive layer, "second" conductive layer, and so on) refer only to the order in which such respective elements are introduced in the relevant discussion of such elements, and are not intended to indicate the order in which such elements are formed, or the relative physical relationship of such elements.

One aspect provides a substrate (e.g., a PCB of an integrated circuit package) including a first dielectric layer, a conductive coin embedded in the first dielectric layer, a first conductive layer formed on a first side of the first dielectric layer, a cavity in the first conductive layer, the cavity located over the conductive coin, and an embedded circuit component arranged in the cavity in the first conductive layer, wherein the embedded circuit component is located over the conductive coin and conductively coupled to the conductive coin. The substrate also includes a second dielectric layer formed over the first conductive layer, a second conductive layer formed over the second dielectric layer, and a via extending through the second dielectric layer, the via electrically connecting the second conductive layer to the embedded circuit component.

In some examples, the via comprises a micro-via having a vertical depth of less than 250 μm.

In some examples, the cavity in the first conductive layer extends through a full thickness of the first conductive layer, and the embedded circuit component is mounted directly on the conductive coin.

In some examples, the cavity in the first conductive layer extends through a partial thickness of the first conductive layer, wherein the cavity defines a reduced thickness region of the first conductive layer over the conductive coin, and the embedded circuit component is mounted on the reduced thickness region of the first conductive layer.

In some examples, a vertical offset between a top surface of the embedded circuit component and a top surface of the first conductive layer laterally outside the cavity is less than 50% of a vertical thickness of the first conductive layer laterally outside the cavity.

In some examples, a vertical offset between a top surface of the embedded circuit component and a top surface of the first conductive layer laterally outside the cavity is less than 25% of a vertical thickness of the first conductive layer laterally outside the cavity.

In some examples, a thickness of the second dielectric layer at a location laterally spaced apart from the embedded circuit component and the conductive coin is less than 250 microns.

In some examples, the via comprises a first micro-via having a vertical depth of less than 250 μm, and the substrate comprises a second micro-via at the location laterally spaced apart from the embedded circuit component and the conductive coin, the second micro-via extending through the second dielectric layer to electrically connect the second conductive layer to the first conductive layer.

In some examples, the substrate includes a third conductive layer formed on a second side of the first dielectric layer opposite the first side of the first dielectric layer, the third conductive layer contacting a second side of the conductive coin opposite the first side of the conductive coin. The conductive coin is sandwiched between the first conductive layer and the third conductive layer, and the third conductive layer is electrically connected to the embedded circuit component through the conductive coin.

In some examples, the conductive coin comprises a solid metal mass. In other examples, conductive coin comprises a thermally conductive, electrically nonconductive component formed between a pair of metal components.

One aspect provides a substrate including a first dielectric layer, a conductive coin embedded in the first dielectric layer, a first conductive layer formed on a first side of the first dielectric layer, the first conductive layer contacting a first side of the conductive coin, an embedded circuit component mounted on the first conductive layer and embedded in a second dielectric layer formed over the first conductive layer, a second conductive layer formed over the second dielectric layer and extending over the embedded circuit component, and a via electrically connecting the second conductive layer to the embedded circuit component.

In some examples, the via comprises a micro-via having a vertical depth of less than 250 μm.

In some examples, the substrate includes a third conductive layer formed on a second side of the first dielectric layer opposite the first side of the first dielectric layer, the third conductive layer contacting a second side of the conductive coin opposite the first side of the conductive coin, wherein the conductive coin is sandwiched between the first conductive layer and the third conductive layer.

In some examples, the third conductive layer is electrically connected to the embedded circuit component through the conductive coin.

In some examples, the substrate includes a via extending through the second dielectric layer at a location spaced apart from the embedded circuit component, the via electrically connecting the second conductive layer to the first conductive layer.

One aspect provides an integrated circuit (IC) package including a substrate and an electronic device. The substrate includes a first dielectric layer, a conductive coin embedded in the first dielectric layer, a first conductive layer formed on a first side of the first dielectric layer, a cavity in the first conductive layer, the cavity located over the conductive coin, and an embedded circuit component arranged in the cavity in the first conductive layer, wherein the embedded circuit component is located over the conductive coin and conductively coupled to the conductive coin. The substrate also includes a second dielectric layer formed over the first conductive layer, a second conductive layer formed over the second dielectric layer, and a via extending through the second dielectric layer, the via electrically connecting the second conductive layer to the embedded circuit component. The electronic device is mounted on a first side of the substrate, and electrically connected to a first respective element of the embedded circuit component through the via.

In some examples, the via comprises a micro-via having a vertical depth of less than 250 μm.

In some examples, the electronic device is electrically connected to a second respective element of the embedded circuit component through the conductive coin.

In some examples, the IC package includes a heat sink mounted on a second side of the substrate opposite the first side of the substrate, wherein the heat sink is thermally coupled to the embedded circuit component through the conductive coin.

One aspect provides a method of forming a substrate, including forming a first dielectric layer including a coin opening, embedding a conductive coin in the coin opening in the first dielectric layer, forming a first conductive layer on a first side of the first dielectric layer, the first conductive layer including a cavity located over the conductive coin, mounting an embedded circuit component in the cavity in the first conductive layer, wherein the mounted embedded circuit component is conductively coupled to the conductive coin, forming a second dielectric layer over the first conductive layer, forming a second conductive layer over the second dielectric layer, and forming a via extending through the second dielectric layer, the via electrically connecting the second conductive layer to the embedded circuit component.

In some examples, forming the via comprises forming a micro-via having a vertical depth of less than 250 μm.

In some examples, forming the first dielectric layer including the coin opening and embedding the conductive coin in the coin opening in the first dielectric layer includes forming a core structure including the first dielectric layer and a metal foil formed on the first dielectric layer, wherein the first dielectric layer includes multiple dielectric sublayers including at least one partially cured dielectric sublayer, forming the coin opening in the core structure, mounting the conductive coin in the coin opening, and curing the at least one partially cured dielectric layer to embed the conductive coin in the core structure.

In some examples, forming the first conductive layer including the cavity located over the conductive coin includes forming the first conductive layer, and etching the cavity in the first conductive layer, which cavity extends through a partial depth or a full depth of the first conductive layer.

In some examples, a vertical offset between a top surface of the embedded circuit component and a top surface of the first conductive layer is less than 50%, or less than 25%, of a vertical thickness of the first conductive layer.

In some examples, forming the via comprises forming a first micro-via having a vertical depth of less than 250 μm, and the method may further include forming a second micro-via at the location laterally spaced apart from the embedded circuit component and the conductive coin, the second micro-via extending through the second dielectric layer to electrically connect the second conductive layer to the first conductive layer.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
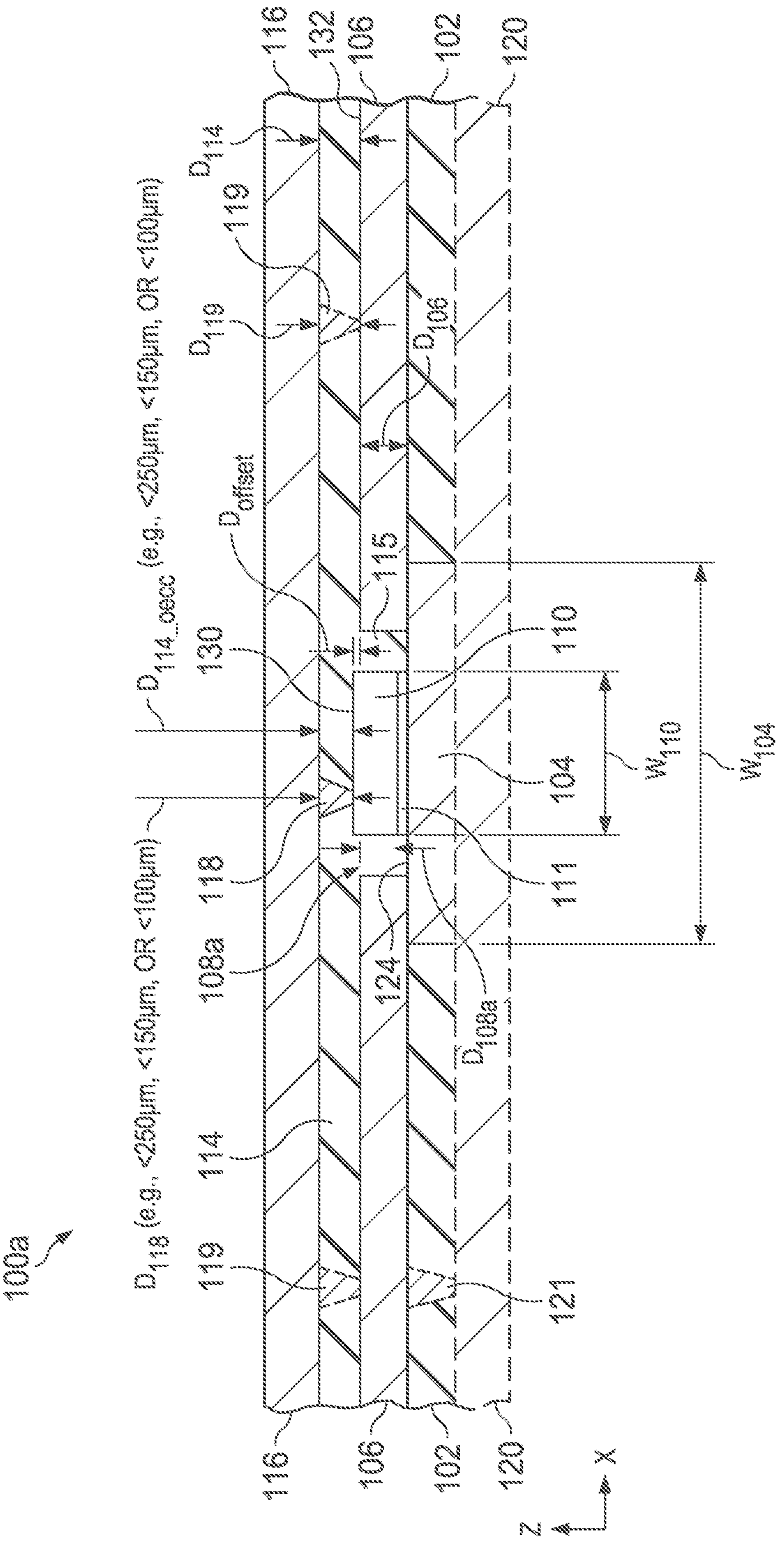
FIG. 1A is a cross-sectional side view of an example embedded component substrate (e.g., PCB) including an embedded circuit component (e.g., die) mounted in a recess in a conductive layer, according to one example.

FIG. 1A is a cross-sectional side view of an example embedded component substrate 100*a* including an embedded circuit component 110 (e.g., die) according to one example. The embedded component substrate 100*a* may comprise a printed circuit board (PCB), interposer, or other substrate of an IC package, for example, system-in-packages (SiPs), flip-chip packages, 2.5D/3D packages, and multi-chip modules, without limitation.

As shown in FIG. 1A, the example embedded component substrate 100*a* (also referred to as substrate 100*a*) may include a first dielectric layer 102, a conductive coin 104 embedded in the first dielectric layer 102, a first conductive layer 106 formed on a first side of the first dielectric layer 102, a cavity 108*a* in the first conductive layer 106 and located over the conductive coin 104, wherein the embedded circuit component 110 is arranged in the cavity 108*a* in the first conductive layer 106 and located over the conductive coin 104. As discussed below, in this example the embedded circuit component 110 is mounted directly on the conductive coin 104.

The example substrate 100*a* may also include a second dielectric layer 114 formed over the first conductive layer 106, a second conductive layer 116 formed over the second dielectric layer 114, and a conductive via 118 extending through the second dielectric layer 114, wherein the conductive via 118 electrically connects the second conductive layer 116 to the embedded circuit component 110.

An optional third conductive layer 120 may be formed on a second side of the first dielectric layer 102 opposite the first side of the first dielectric layer 102 (on which the first conductive layer 106 is formed), wherein the conductive coin 104 is sandwiched between the first conductive layer 106 and the optional third conductive layer 120, and wherein the third conductive layer 120 is conductively connected to the embedded circuit component 110 through the conductive coin 104, e.g., for transferring heat away from the embedded circuit component 110 and (optionally) for communicating electrical signals to and/or from the embedded circuit component 110 through the conductive coin 104. In some examples, optional conductive via(s) 121 extending through the first dielectric layer 102 may conductively connect the first conductive layer 106 to the third conductive layer 120 (at location(s) laterally spaced apart from the embedded circuit component 110), e.g., to define electrically connection(s) to the bottom side of the embedded circuit component 110 through the conductive coin 104 and the third conductive layer 120. Respective optional conductive via(s) 121 may comprise micro-vias, blind-hole vias, drilled vias, or other types of vias, e.g., depending on the thickness of the first dielectric layer 102. In some examples, electrical contact to the bottom side of the embedded circuit component 110 may be defined through the conductive coin 104 and elements(s) of the first conductive layer 106 formed on the conductive coin 104, such that optional conductive via(s) 121 for providing contact to the embedded circuit component 110 through the third conductive layer 120 may be omitted.

In some examples the first dielectric layer 102 may include pre-impregnated glass-fiber fabrics (prepregs) or filled resin sheet materials. These fabrics or materials may be epoxy based or resin based, including benzoxazine, polyimide-blend, bismaleimide-triazine or other suitable dielectric material and in some examples may include multiple sub-layers of the same or different dielectric materials (e.g., cores (copper clad laminates with fully cured dielectric), resin coated copper (RCC), sheet materials and/or prepregs, without limitation).

The conductive coin 104 embedded in the first dielectric layer 102 may comprise a solid mass of copper or other metal or metals at least partially embedded in the first dielectric layer 102. e.g., wherein the conductive coin 104 (in the z-direction shown in FIG. 1A) is laterally surrounded by dielectric material of the first dielectric layer 102. The conductive coin 104 may be embedded in the first dielectric layer 102 in any suitable manner, using any suitable process. For example, FIGS. 7A-7D discussed below show one example process of embedding a conductive coin in a substate "core" including a dielectric layer (e.g., including multiple dielectric sub-layers) sandwiched between a pair of copper foil layers.

The first conductive layer 106 formed on the first side of the first dielectric layer 102 may comprise copper or other metal, having a depth (or thickness) $D_{106}$ in the z-direction, e.g., in the range of 300-500 μm. In this example, a vertical cavity depth $D_{108a}$ of the cavity 108*a* extends through the full depth (thickness) $D_{106}$ of the first conductive layer 106 to expose a top surface 124 of the conductive coin 104. The embedded circuit component 110 may be mounted directly on the exposed top surface 124 of the conductive coin 104 (e.g., using a bond 111 comprising a solder, a silver or copper sinter, a transient liquid phase sinter, or conductive epoxy or pressure-less sinter, without limitation), to conductively connect (e.g., electrically and thermally) the embedded circuit component 110 to the conductive coin 104, e.g., for transmitting electrical signals and/or thermal energy between the embedded circuit component 110 and conductive coin 104. In some examples, e.g., as shown in FIG. 1A, a lateral width $W_{104}$ of the conductive coin 104 is greater than a lateral width $W_{110}$ of the overlying embedded circuit component 110, in both the x-direction and y-direction (y-direction not shown).

In some examples, a top surface 130 of the embedded circuit component 110 (embedded circuit component top surface 130) is flush (co-planar) or substantially flush with a top surface 132 of the first conductive layer 106 (first conductive layer top surface 132) at a location laterally outside the cavity 108*a*. For example, a vertical offset $D_{offset}$ between the embedded circuit component top surface 130 and the first conductive layer top surface 132 may be less than 50% of the depth (thickness) $D_{106}$ of the first conductive layer 106 at a location laterally outside the cavity 108*a*. In some examples, the vertical offset $D_{offset}$ is less than 25% of the depth (thickness) $D_{106}$ of the first conductive layer 106 at a location laterally outside the cavity 108*a*. In some examples, the vertical offset $D_{offset}$ is less than 150 μm, less than 100 μm, or less than 50 μm. In some examples, the vertical offset $D_{offset}$ may be controlled by forming the first conductive layer 106 with a depth $D_{106}$ selected based on the thickness (z-direction) of the embedded circuit component 110.

The second dielectric layer 114 may include a single or may include multiple sub-layers of the same or different dielectric materials, and the second conductive layer 116 formed over the second dielectric layer 114 may comprise copper or other metal. In some examples, dielectric material of the second dielectric layer 114 may extend down into areas of the cavity 108*a* unfilled by the embedded circuit component 110, as indicated at 115. In other examples, dielectric material 115 may be deposited into cavity 108*a* prior to forming the second dielectric layer 114.

The second conductive layer 116 may be conductively connected (e.g., electrically and thermally) to the embedded circuit component 110 by at least one conductive via 118, e.g., at least one micro-via as discussed below. Although FIG. 1A shows a single conductive via 118, and the following discussion sometimes refers to conductive via 118 in the singular, it should be understood the example substrate 100*a* may include any number of conductive vias 118 conductively connecting (e.g., electrically and thermally) the second conductive layer 116 to the embedded circuit component 110. In addition to conductive via 118, the second conductive layer 116 may (optionally) be conductively connected (e.g., electrically and thermally) to the first conductive layer 106 (at location(s) laterally spaced apart from the embedded circuit component 110) by at least one conductive via 119.

In some examples, the second dielectric layer 114 is formed with a relatively small thickness (vertical depth in the z-direction) at a location over the embedded circuit component 110, indicated at $D_{114\_oecc}$, to allow for a relatively small conductive via 118 (e.g., a micro-via) to connect the overlying second conductive layer 116 to the underlying embedded circuit component 110. For example, in some examples the second dielectric layer 114 is formed with a thickness $D_{114\_oecc}$ of less than 250 μm, so that the conductive via 118 may have a vertical depth $D_{118}$ of less than 250 μm. In some examples the second dielectric layer 114 is formed with a thickness $D_{114\_oecc}$ of less than 150 μm, allowing a conductive via 118 with a vertical depth $D_{118}$ of less than 150 μm. In one example, the second dielectric layer 114 is formed with a thickness $D_{114\_oecc}$ of less than 100 μm, allowing a conductive via 118 with a vertical depth $D_{118}$ of less than 100 μm. Accordingly, in some examples conductive via 118 may be formed as a micro-via with a vertical depth $D_{118}$ of less than 250 μm, less than less than 150 μm, or less than 100 μm, wherein a micro-via is defined herein a hole with a 1:1 aspect ratio that does not exceed a 250 μm depth.

In addition, as a result of the embedded circuit component top surface 130 being flush or substantially flush with the first conductive layer top surface 132 (due to the embedded circuit component 110 being mounted in the cavity 108*a*), the second dielectric layer 114 may have a substantially uniform vertical (z-direction) thickness at (a) locations above the embedded circuit component 110, indicated as thickness $D_{114\_oecc}$ as discussed above, and (b) locations laterally spaced away from the embedded circuit component 110, indicated as thickness $D_{114}$. The difference between thickness $D_{114\_oecc}$ and thickness $D_{114}$ may correspond with the vertical offset $D_{offset}$ (discussed above) between the embedded circuit component top surface 130 and the first conductive layer top surface 132. Accordingly, in some examples, the difference between thickness $D_{114\_oecc}$ and thickness $D_{114}$ may be less than 150 μm, less than 100 μm, or less than 50 μm. In some examples, both the thickness $D_{114\_oecc}$ and thickness $D_{114}$ of the second dielectric layer 114 are less than 250 μm, or less than 150 μm, or less than 100 μm.

In some examples, substrate 100*a* includes both (a) conductive via(s) 118 located over the embedded circuit component 110 and extending vertically through the thickness $D_{114\_oecc}$ of the second dielectric layer, and (b) optional conductive via(s) 119 at location(s) laterally spaced apart from the embedded circuit component 110 and extending vertically through the thickness $D_{114}$ of the second dielectric layer. In such examples, due to the substantially uniform thickness of the second dielectric layer 114 (e.g., wherein the difference between thickness $D_{114\_oecc}$ and thickness $D_{114}$ is less than 150 μm, less than 100 μm, or less than 50 μm), the conductive via(s) 118 and conductive via(s) 119 may be formed concurrently with respectively similar via depths. In some examples, the conductive via(s) 118 and conductive via(s) 119 may be concurrently formed as micro-vias, and wherein respective micro-conductive vias 118 and 119 have respective depths $D_{118}$ and $D_{119}$ of less than 250 μm, less than less than 150 μm, or less than 100 μm.

In some examples, the example substrate 100*a* may include one or more additional dielectric layers and/or conductive layers (not shown) formed on one or both of the top side and/or bottom side of the structure shown in FIG. 1A, e.g., defining respective conductive pathways for conducting electrical signals to and from the embedded circuit component 110 and for transferring heat from the embedded circuit component 110 (e.g., toward a heat sink or other thermal management structure or system thermally coupled to the substrate 100*a*).

Respective conductive elements of the example substrate 100*a*, for example including conductive structures formed in first conductive layer 106, second conductive layer 116 and/or optional third conductive layer 120, conductive vias 118 and/or 119, and/or conductive coin 104, may define electrically connections between respective elements provided in the embedded circuit component 110 and external circuitry (not shown) mounted to the substrate 100*a*.

Although the first conductive layer 106, second conductive layer 116, and optional third conductive layer 120 (and similarly, the first conductive layer 306, second conductive layer 316, and optional third conductive layer 320 shown in FIG. 3 discussed below) are respectively illustrated as continuous conductive structures (except for cavity 108 formed in the first conductive layer 106), respective conductive layers 106, 116 and/or 120 may include patterns of conductive tracks or traces (e.g., copper tracks or traces) separated by non-conductive/dielectric material. For example, FIGS. 2A-2C discussed below illustrate example spaced-apart tracks or traces formed in respective conductive layers (e.g., first conductive layer 106, second conductive layer 116, and a subsequently formed fourth conductive layer 212), e.g., for defining respective paths providing electrical contact to the embedded circuit component 110.

As another example, respective conductive elements of the example substrate 100*a* may define (a) a first electrical connection, through the conductive via (e.g., micro-via) 118, connecting first external circuitry (not shown) to a first element or component of the embedded circuit component 110 and (b) a second electrical connection, through the conductive coin 104, connecting second respective external circuitry (not shown), i.e. external to substrate 100*a*, to a second element or component of the embedded circuit component 110.

Figure 1B:
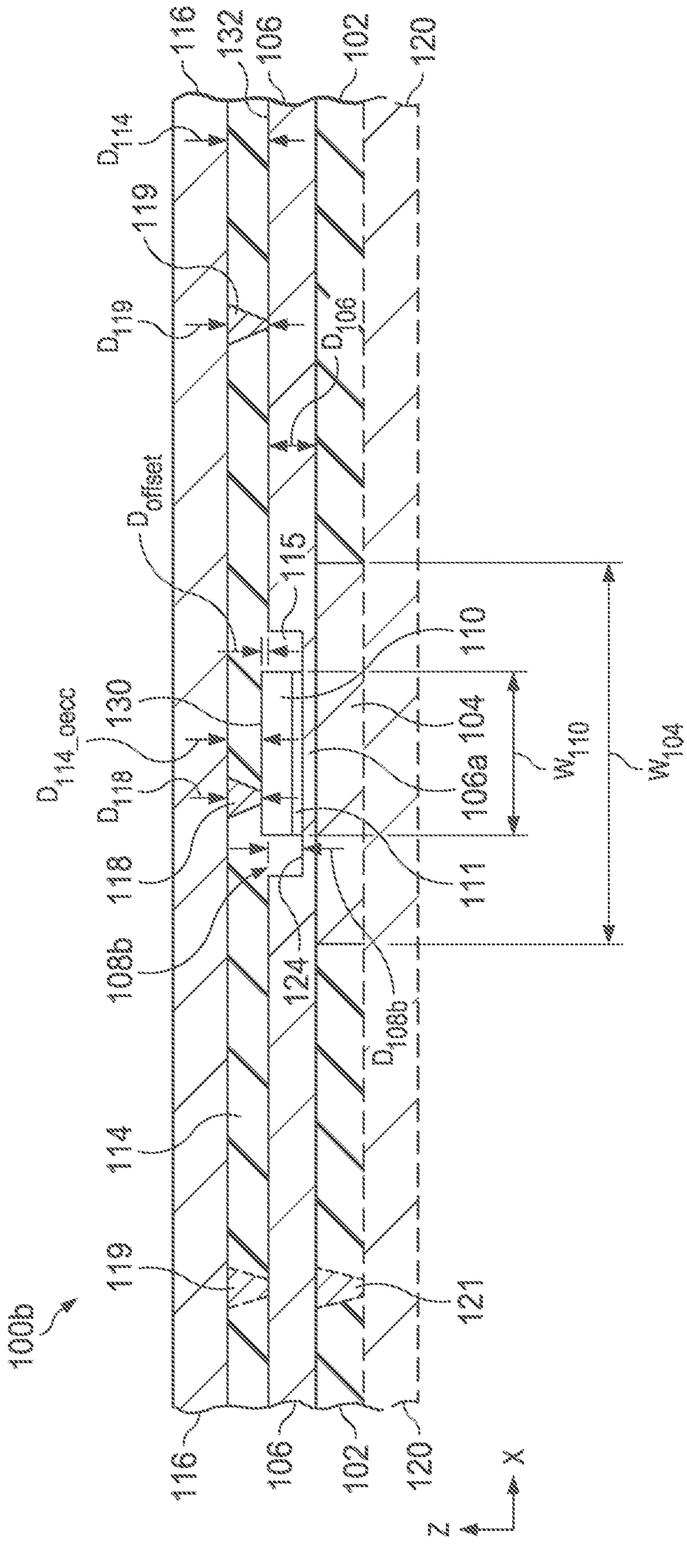
FIG. 1B is a cross-sectional side view of another example embedded component substrate (e.g., PCB) including an embedded circuit component (e.g., die) mounted in a recess in a conductive layer, according to another example.

FIG. 1B is a cross-sectional side view of another example embedded component substrate 100*b* (or substrate 100*b*) including the embedded circuit component 110 (e.g., die) according to one example. The example substrate 100*b* may be similar to the example substrate 100*a* shown in FIG. 1A and discussed above, with like reference numbers referring to like parts. However, example substrate 100*b* may differ from example substrate 100*a* in the following respect. As discussed above, in the example substrate 100*a* shown in FIG. 1A, the embedded circuit component 110 is mounted in a cavity 108*a* in the first conductive layer 106 having a vertical cavity depth $D_{108a}$ extending through the full vertical depth $D_{106}$ of the first conductive layer 106, wherein the embedded circuit component 110 is mounted directly on the exposed top surface 124 of the conductive coin 104. In contrast, in the example substrate 100*b* shown in FIG. 1B, the embedded circuit component 110 is mounted in a cavity 108*b* in the first conductive layer 106 having a vertical cavity depth $D_{108b}$ extending only partially through the vertical depth $D_{106}$ of the first conductive layer 106 (i.e., $D_{108b}<D_{106}$). As shown in FIG. 1B, the cavity 108*b* defines a reduced thickness region 106*a* of the first conductive layer 106 in an area over the conductive coin 104. The embedded circuit component 110 may be mounted on this reduced thickness region 106*a* of the first conductive layer 106 (e.g., using an optional bond 111), and thereby conductively connected (electrically and thermally) to the conductive coin 104 through the reduced thickness region 106*a*, e.g., for transferring heat away from the embedded circuit component 110 and/or for communicating electrical signals to and/or from the embedded circuit component 110 through the reduced thickness region 106*a* of the conductive layer 106 and through the conductive coin 104.

As stated above regarding the example substrate 100*a*, in some examples the example substrate 100*b* may include one or more additional dielectric layers and/or conductive layers (not shown) formed on one or both of the top side and/or bottom side of the structure shown in FIG. 1B, e.g., defining respective conductive pathways for conducting electrical signals to and from the embedded circuit component 110 and for transferring heat from the embedded circuit component 110 (e.g., toward a heat sink or other thermal management structure or system thermally coupled to the substrate 100*b*).

Figure 2A:
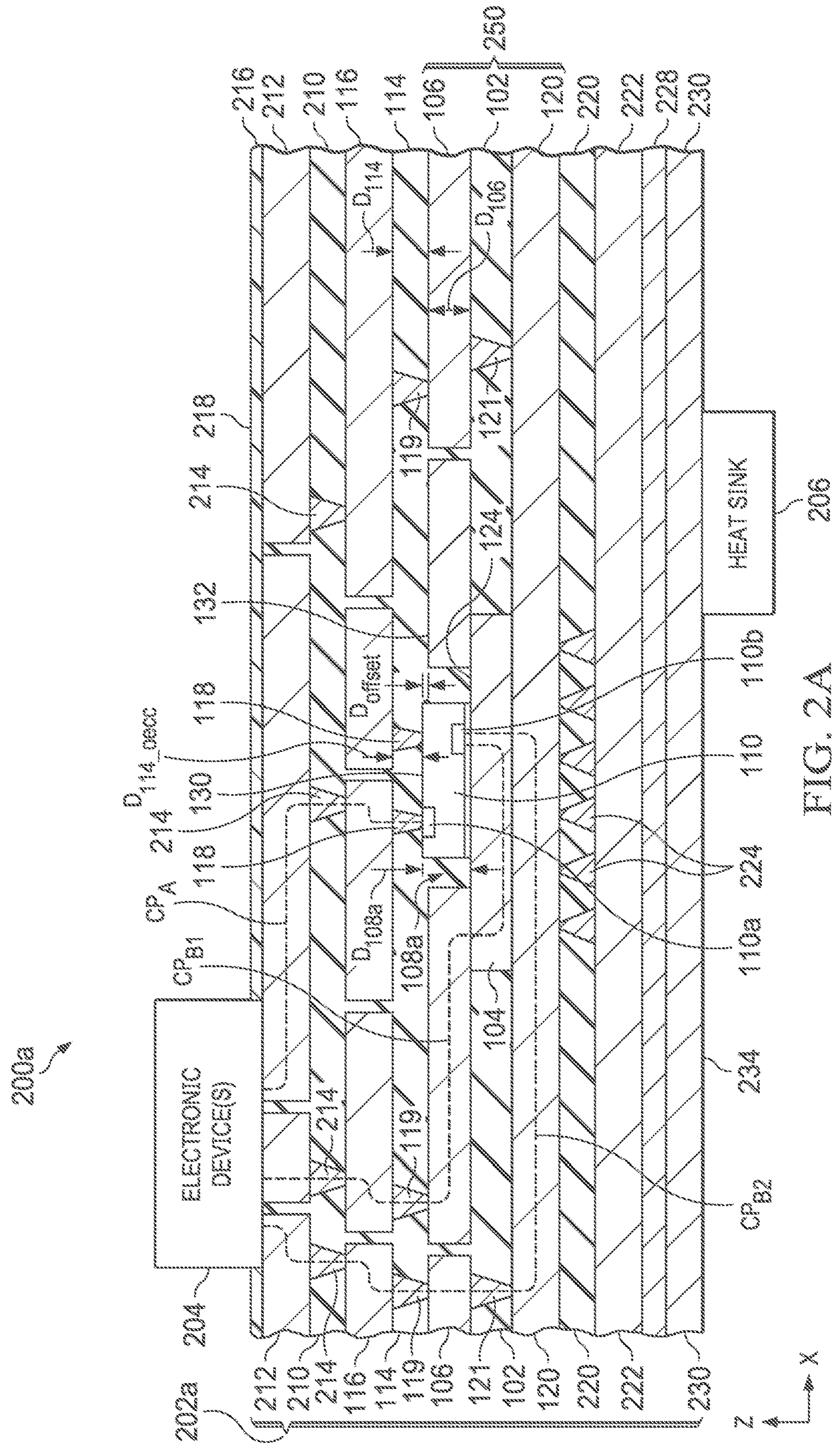
FIG. 2A is a cross-sectional side view of an example IC package including the example embedded component substrate corresponding with the example substrate shown in FIG. 1A, with electronic device(s) and a heat sink mounted thereon, according to one example.

FIG. 2A is a cross-sectional side view of an example IC package 200*a* including an example embedded component substrate 202*a* (or substrate 202*a*), at least one electronic device 204 mounted on a first side 218 of the substrate 202*a*, and a heat sink 206 mounted on a second side 234 of the substrate 202*a*. The example substrate 202*a* includes the elements of the example embedded component substrate 100*a* shown in FIG. 1A, along with additional elements discussed below.

Accordingly, example substrate 202*a* includes the first dielectric layer 102, the conductive coin 104 embedded in the first dielectric layer 102, the first conductive layer 106 formed on the first side of the first dielectric layer 102, and the cavity 108*a* in the first conductive layer 106 and having the vertical cavity depth $D_{108a}$ extending through the full depth (thickness) $D_{106}$ of the first conductive layer 106 to expose the top surface 124 of the conductive coin 104. The embedded circuit component 110 is mounted directly on the exposed top surface 124 of the conductive coin 104 (e.g., using optional bond 111). As discussed above with reference to FIG. 1A, the embedded circuit component top surface 130 is flush (co-planar) or substantially flush with the first conductive layer top surface 132 at a location laterally outside the cavity 108*a*, for example, wherein the vertical offset $D_{offset}$ between the embedded circuit component top surface 130 and first conductive layer top surface 132 is less than 50% or less than 25% of the depth (thickness) $D_{106}$ of the first conductive layer 106.

The substrate 202*a* includes the second dielectric layer 114 formed over the first conductive layer 106, the second conductive layer 116 formed over the second dielectric layer 114, as discussed above, and the third conductive layer 120 formed on the second side of the first dielectric layer 102 (the bottom side in the example orientation shown in FIG. 2A) and conductively connected to the embedded circuit component 110 through the conductive coin 104.

In some examples, the first dielectric layer 102 including the conductive coin 104 embedded therein, the first conductive layer 106 formed on the first side of the first dielectric layer 102, and the third conductive layer 120 formed on the second side of the first dielectric layer 102, may collectively define a substrate core 250, which may be formed using any suitable process. The embedded circuit component 110 may be mounted to the substrate core 250, e.g., in the cavity 108 formed in the first conductive layer 106, and the further dielectric and conductive layers of the substrate 200*a* (e.g., layers 114, 116, 210, 212, 218, 220, 222, 228, and 230 discussed below) may be respectively formed on opposing sides (e.g., top and bottom sides in the orientation shown in FIG. 2A) of the substrate core 250.

On the top side of the substrate core 250 (in the example orientation shown in FIG. 2A), the substrate 202*a* includes multiple conductive vias 118 and 119 extending through the second dielectric layer 114, wherein (a) the conductive vias 118 extend vertically through the second dielectric layer thickness $D_{114\_oecc}$ at locations over the embedded circuit component 110 to conductively connect the second conductive layer 116 to the embedded circuit component 110, and (b) the conductive vias 119 extend vertically through the second dielectric layer thickness $D_{114}$ at locations laterally spaced apart from the embedded circuit component 110 to conductively connect the second conductive layer 116 to the first conductive layer 106. In some examples, conductive vias 118 and conductive vias 119 may be concurrently formed as micro-vias, and wherein respective micro-conductive vias 118 and 119 have respective vertical (z-direction) depths $D_{118}$ and $D_{119}$ of less than 250 μm, less than less than 150 μm, or less than 100 μm.

As shown in FIG. 2A, the example substrate 202*a* also includes a third dielectric layer 210 formed over the second conductive layer 116, a fourth conductive layer 212 formed over the third dielectric layer 210, and a plurality of conductive vias (e.g., micro-vias) 214 conductively connecting the fourth conductive layer 212 with the underlying second conductive layer 116. In some examples, a top coating 216, e.g., comprising an acrylic resin or polymeric film, is formed over the fourth conductive layer 212. The top coating 216 may define the first side 218 of the substrate 202*a*.

At least one electronic device 204 (e.g., comprising any electronic circuitry) may be mounted to, or secured on, the first side 218 of the substrate 202*a*, and may be electrically connected to the embedded circuit component 110 through conductive paths defined by respective conductive elements of the substrate 202*a*, for example one or more of the conductive layers 106, 116, 120 and/or 212, conductive vias 118, 119, and/or 214, and/or the conductive coin 104. For example, the at least one electronic device 204 may include (a) first respective circuitry electrically connected to a respective first element 110*a* of the embedded circuit component 110 through a conductive path $CP_A$ passing through respective elements of conductive layers 212 and 116 and respective vias 214 and 218, and (b) second respective circuitry electrically connected to a respective second element 110*b* of the embedded circuit component 110 through either (1) a conductive path $CP_{B1}$ passing through respective elements of conductive layers 212, 116, and 106, respective vias 214 and 119, and the conductive coin 104, or (2) a conductive path $CP_{B2}$ passing through respective elements of conductive layers 212, 116, 106, and 120, respective vias 214 119, and 121, and the conductive coin 104.

On the bottom side of the substrate core 250 (in the example orientation shown in FIG. 2A), the substrate 202*a* may include thermally conductive structures for transferring heat from the embedded circuit component 110 to the heat sink 206 mounted on the second side 234 of the substrate 202*a*. For example, below the embedded circuit component 110, the example substrate 202*a* may include a fourth dielectric layer 220 formed under the third conductive layer 120, a fifth conductive layer 222 formed under the fourth dielectric layer 220, a thermally conductive, electrically nonconductive pre-preg layer 228 formed under the fifth conductive layer 222, and a sixth conductive layer 230 defining the second side 234 of the substrate 202*a* formed under the thermally conductive pre-preg layer 228. The term formed under is based on the example orientation shown in FIG. 2A, whereas in production the orientation may be reversed, so that the respective fourth dielectric layer 220, fifth conductive layer 222, pre-preg layer 228 and sixth conductive layer 230 may be formed over the respective underlying layers. An array of conductive vias 224 may conductively connect the fifth conductive layer 222 with the third conductive layer 120. In this manner, the heat sink 206 is thermally coupled to the embedded circuit component 110 through the conductive coin 104, third conductive layer 120, conductive vias 224, fifth conductive layer 222, pre-preg layer 228, and sixth conductive layer 230. The thermally conductive, electrically nonconductive pre-preg layer 228 may function to electrically isolate the embedded circuit component 110 from electronics on or coupled to the second side 234 of the substrate 202*a*, while allowing heat transfer from the embedded circuit component 110 to the heat sink 206.

Although conductive layers 106, 116, 120, 212, 222, and 230 are respectively illustrated as continuous conductive structures (except for cavity 108 formed in the first conductive layer 106), respective conductive layers 106, 116, 120, 212, 222 and/or 230 may include patterns of conductive tracks or traces (e.g., copper tracks or traces) separated by non-conductive/dielectric material.

Figure 2B:
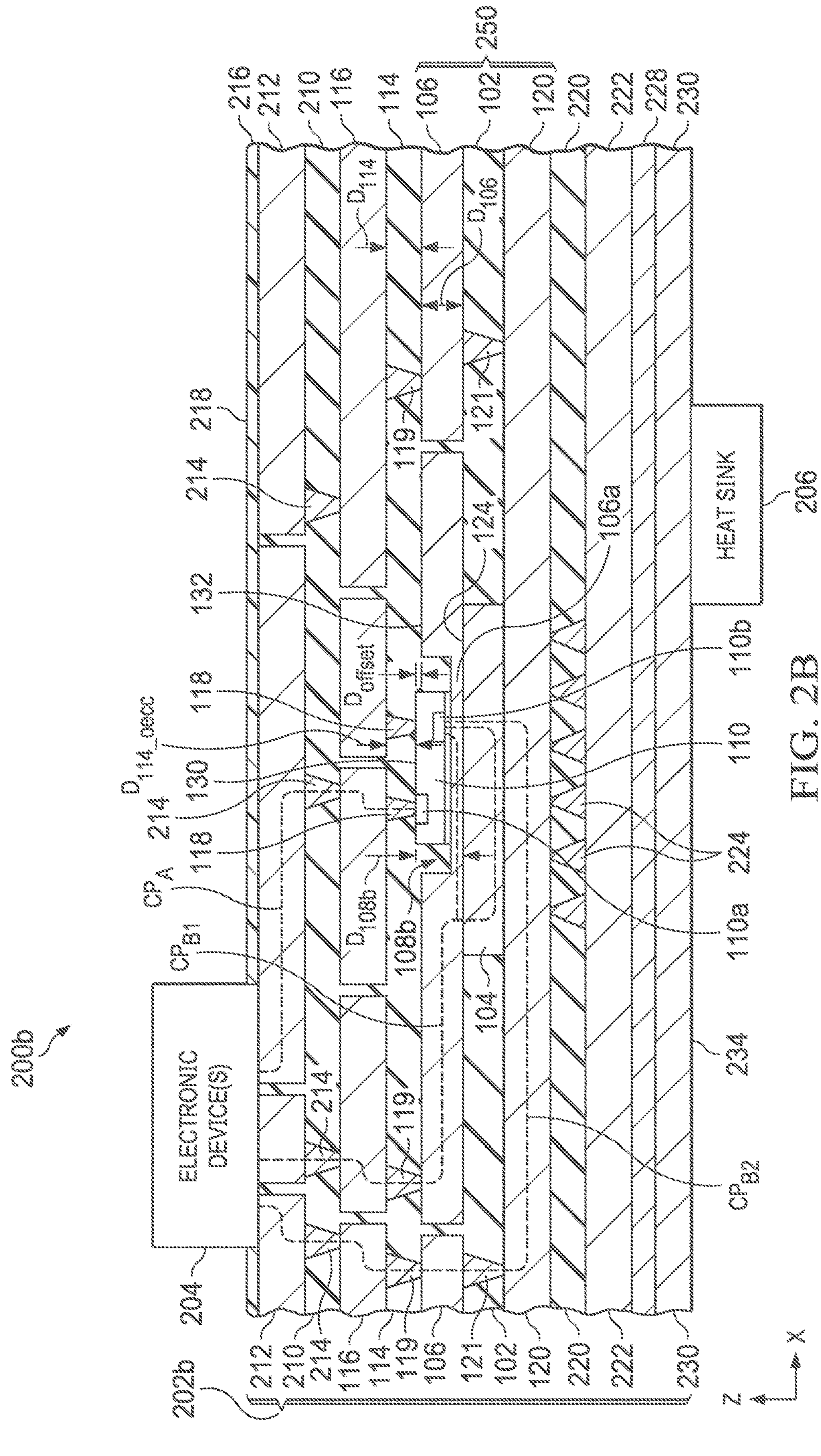
FIG. 2B is a cross-sectional side view of an example IC package including the example embedded component substrate corresponding with the example substrate shown in FIG. 1B, with electronic device(s) and a heat sink mounted thereon, according to one example.

FIG. 2B is a cross-sectional side view of an example IC package 200*b* including an example embedded component substrate 202*b* (or substrate 202*b*), at least one electronic device 204 mounted on a first side 218 of the substrate 202*a*, and a heat sink 206 mounted on a second side 234 of the substrate 202*a*. The example substrate 202*b* is similar to the example substrate 202*b* shown in FIG. 2A and discussed above, but includes the elements of the example substrate 100*b* shown in FIG. 1B, rather than the elements of the example substrate 100*a*.

Thus, in the substrate 202*b* of the example IC package 200*b*, the cavity 108*b* in the first conductive layer 106 extends only partially through the vertical depth $D_{106}$ of the first conductive layer 106, thereby defining the reduced thickness region 106*a* of the first conductive layer 106 in an area over the conductive coin 104. The embedded circuit component 110 may be mounted on this reduced thickness region 106*a* of the first conductive layer 106 (e.g., using an optional bond 111), and thereby conductively connected (electrically and thermally) to the conductive coin 104 through the reduced thickness region 106*a*, e.g., as discussed above with respect to FIG. 1B.

Remaining elements of the substrate 202*b* and example IC package 200*b* may be similar to corresponding elements of the substrate 202*a* and example IC package 200*a* shown in FIG. 2A and discussed above, with like reference numbers referring to like elements.

At least one electronic device 204 (e.g., comprising any electronic circuitry) may be mounted to, or secured on, the first side 218 of the substrate 202*b*, and may be electrically connected to the embedded circuit component 110 through conductive paths defined by respective conductive elements of the substrate 202*b*, for example one or more of the conductive layers 106, 116, 120 and/or 212, conductive vias 118, 119, and/or 214, and/or the conductive coin 104. For example, the at least one electronic device 204 may include (a) first respective circuitry electrically connected to a respective first element 110*a* of the embedded circuit component 110 through a conductive path $CP_A$ passing through respective elements of conductive layers 212 and 116 and respective vias 214 and 218, and (b) second respective circuitry electrically connected to a respective second element 110*b* of the embedded circuit component 110 through either (1) a conductive path $CP_{B1}$ passing through respective elements of conductive layers 212, 116, and 106, respective vias 214 and 119, and the conductive coin 104, or (2) a conductive path $CP_{B2}$ passing through respective elements of conductive layers 212, 116, 106, and 120, respective vias 214 119, and 121, and the conductive coin 104.

Figure 2C:
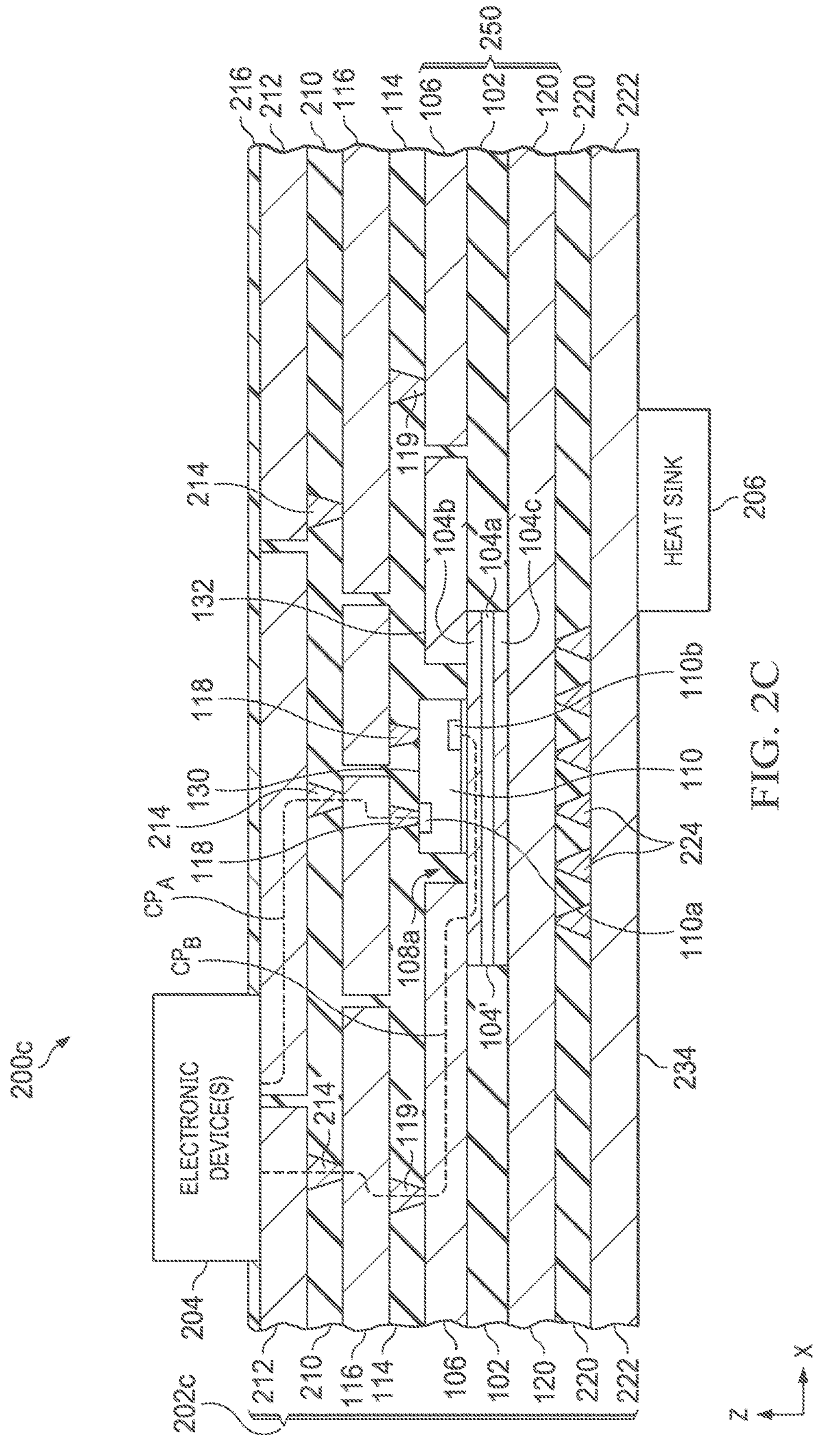
FIG. 2C is a cross-sectional side view of an example IC package including an example embedded component substrate including a conductive coin including a thermally conductive, electrically nonconductive component, with electronic device(s) and a heat sink mounted on the embedded component substrate, according to one example.

FIG. 2C is a cross-sectional side view of an example IC package 200*c* including an example embedded component substrate 202*c*, at least one electronic device 204 mounted on a first side 218 of the substrate 202*c*, and a heat sink 206 mounted on a second side 234 of the substrate 202*a*. The example substrate 202*c* is generally similar to the example substrates 202*a* and 202*b* shown in FIGS. 2A and 2B and discussed above. However, instead of the conductive coin 104 incorporated in the example substrates 202*a* and 202*b*, which may comprise a solid metal mass, substrate 202*c* includes an example conductive coin 104' comprising a thermally conductive, electrically nonconductive component to electrically isolate the embedded circuit component 110 from conductive structures below the conductive coin 104' (i.e., conductive structures on the opposite side of the conductive coin 104' from the embedded circuit component 110), while allowing heat transfer through the vertical thickness of the conductive coin 104', e.g., to transfer heat from the embedded circuit component 110 to a heat sink 206 or other heat transfer structure or device.

As shown in FIG. 2C, the example conductive coin 104' includes a thermally conductive, electrically nonconductive component 104*a* arranged between a first metal component 104*b* and a second metal component 104*c*. In some examples, the thermally conductive, electrically nonconductive component 104*a* may comprise a thermal conductive organic layer, for example a thermal prepreg layer, a printed dielectric layer, or a ceramic-filled dielectric sheet. In some examples, the electrically nonconductive component 104*a* may comprise aluminium oxide ($Al_2O_3$), aluminium nitride (AlN), silicon nitride ($Si_3N_4$), or other suitable ceramic.

In some examples, the first metal component 104*b* and a second metal component 104*c* on opposing sides of the thermally conductive, electrically nonconductive component 104*a* may allow direct metal plating on both the first side (top side) and second side (bottom side) of the conductive coin 104', e.g., to allow plating (e.g., copper plating) directly of the first conductive layer 106 on the first side (top side) of the conductive coin 104' and plating (e.g., copper plating) of the third conductive layer 120 directly on the first side (top side) of the conductive coin 104'.

The first metal component 104*b* and a second metal component 104*c* on opposing sides of the thermally conductive, electrically nonconductive component 104*a* may comprise any suitable metal with any suitable form and thickness. In some examples, the first metal component 104*b* comprises a solid metal mass (e.g., a solid copper mass) and the second metal component 104*c* comprises a metal film (e.g., a copper film). In other examples, the first metal component 104*b* comprises a metal film (e.g., a copper film) and the second metal component 104*c* comprises a solid metal mass (e.g., a solid copper mass). In other examples, the first metal component 104*b* comprises a first solid metal mass (e.g., a first solid copper mass) and the second metal component 104*c* comprises a second solid metal mass (e.g., a second solid copper mass).

As shown in FIG. 2C, due to the presence of the thermally conductive, electrically nonconductive component 104*a* to electrically isolate the embedded circuit component 110 from structures below the conductive coin 104', the thermally conductive, electrically nonconductive pre-preg layer 228 included in substrates 202*a* and 202*b* shown in FIGS. 2A and 2B (discussed above) may optionally be omitted.

Figure 3:
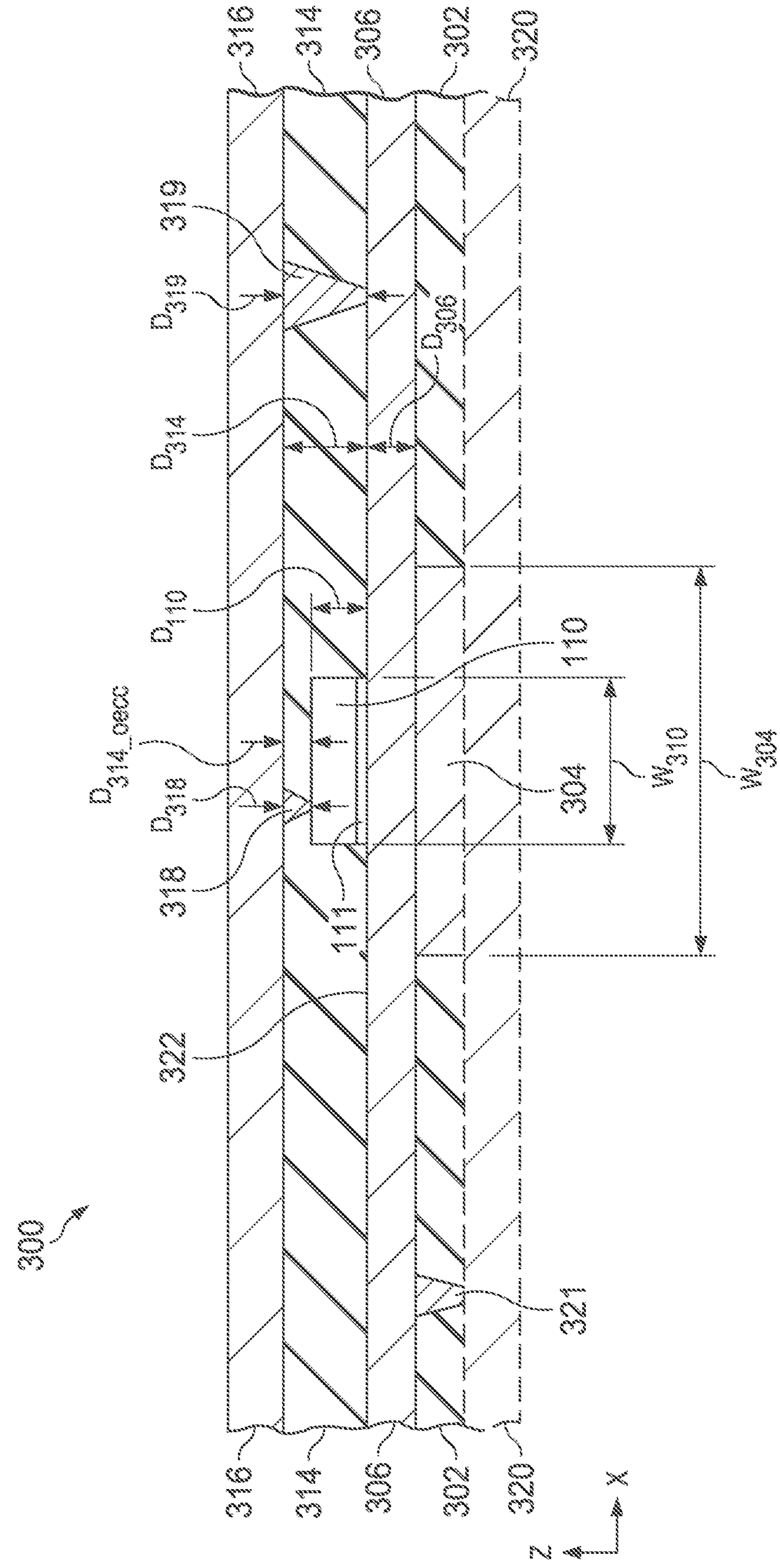
FIG. 3 is a cross-sectional side view of an example embedded component substrate (e.g., PCB) including an embedded circuit component (e.g., die) mounted on a conductive layer, according to one example.

FIG. 3 is a cross-sectional side view of another example embedded component substrate 300 (or substrate 300) including the embedded circuit component 110 (e.g., die) according to one example. Unlike the example substrate 100*a* and 100*b* shown in FIGS. 1A and 1B and discussed above, the embedded circuit component 110 is mounted on a uniform-thickness conductive layer (first conductive layer 306 discussed below), rather than being mounted in a cavity formed in a conductive layer.

As shown in FIG. 3, the example substrate 300 may include a first dielectric layer 302, a conductive coin 304 embedded in the first dielectric layer 302, and a first conductive layer 306 formed on a first side of the first dielectric layer 302. The embedded circuit component 110 is mounted on a top surface 322 of the first conductive layer 306, wherein the embedded circuit component 110 is electrically and thermally coupled to the conductive coin 304 through the first conductive layer 306. In some examples, e.g., as shown in FIG. 3, a lateral width $W_{304}$ of the conductive coin 304 is greater than a lateral width $W_{110}$ of the overlying embedded circuit component 110, in both the x-direction and y-direction (y-direction not shown).

The substrate 300 includes a second dielectric layer 314 formed over the first conductive layer 306 and extending over the embedded circuit component 110, and a second conductive layer 316 formed over the second dielectric layer 314. The second dielectric layer 314 has a z-direction thickness $D_{314\_oecc}$ over the embedded circuit component 110 and a larger z-direction thickness $D_{314}$ at locations laterally spaced apart from the embedded circuit component 110. As can be understood from FIG. 3, the thickness $D_{314}$ of second dielectric layer 314 may correspond with a vertical thickness $D_{110}$ of the embedded circuit component 110 (including the optional bond 111) plus the thickness $D_{314\_oecc}$ of the second dielectric layer 314 over the embedded circuit component 110.

The substrate 300 include (a) at least one conductive via 318 (e.g., at least one micro-via 318) conductively connecting the second conductive layer 316 to the embedded circuit component 110 (i.e., extending through the thickness $D_{314\_oecc}$ of the second dielectric layer 314) and optionally (b) at least one conductive via 319 conductively connecting the second conductive layer 316 to the underlying first conductive layer 306 (i.e., extending through the larger thickness $D_{314}$ of the second dielectric layer 314). In some examples, substrate 300 may include optional conductive via(s) 321 extending through the first dielectric layer 302 to conductively connect the first conductive layer 306 to the third conductive layer 320 (at location(s) laterally spaced apart from the embedded circuit component 110), e.g., to define electrically connection(s) to the bottom side of the embedded circuit component 110 through the third conductive layer 320, conductive coin 104, and first conductive layer 306. Respective optional conductive via(s) 321 may comprise micro-vias, blind-hole vias, drilled vias, or other types of vias, e.g., depending on the thickness of the first dielectric layer 302.

In some examples, the second dielectric layer 314 is formed with a relatively small thickness $D_{314\_oecc}$ over the embedded circuit component 110 to allow for relatively small conductive via(s) 318, for example micro-via(s), to connect the second conductive layer 316 to the underlying embedded circuit component 110. For example, in some examples the second dielectric layer 314 is formed with a thickness $D_{314\_oecc}$ of less than 250 μm, less than 150 μm, or less than 100 μm, so that conductive via(s) 318 may have a vertical depth $D_{318}$ of less than 250 μm, less than 150 μm, or less than 100 μm. Accordingly, in some examples conductive via(s) 318 may be formed as micro-via(s) and with a respective vertical depth $D_{318}$ of less than 250 μm, less than less than 150 μm, or less than 100 μm.

In some examples, e.g., as discussed below with reference to FIGS. 6D and 6E, the second dielectric layer 314 has a multi-layer construction, e.g., wherein one or more first dielectric layers are formed, the embedded circuit component 110 is mounted in an opening in the first dielectric layer(s), and a second dielectric layer is formed over the first dielectric layer(s) and extending over the top of the mounted embedded circuit component 110.

As mentioned above, the at least one conductive via 319 may extend through the second dielectric layer thickness $D_{314}$, which may correspond with the embedded circuit component thickness $D_{110}$ plus the second dielectric layer thickness $D_{314\_oecc}$ over the embedded circuit component 110. In some examples, the second dielectric layer 314 may be formed with a thickness $D_{314}$ in the range of 400-700 μm. In some examples, conductive via(s) 319 may be formed as blind vias or drilled vias. In some examples, conductive via(s) 318 are formed as micro-via(s) (e.g., with a respective vertical depth $D_{318}$ of less than 250 μm, less than less than 150 μm, or less than 100 μm), and conductive via(s) 318 are formed as blind vias or drilled vias (e.g., with a respective vertical depth $D_{319}$ substantially greater than 250 μm, e.g., in the range of 400-700 μm).

An optional third conductive layer 320 may be formed on a second side of the first dielectric layer 302 opposite the first side of the first dielectric layer 302 (on which the first conductive layer 306 is formed), wherein the conductive coin 304 is sandwiched between the first conductive layer 306 and the optional third conductive layer 320, and wherein the third conductive layer 320 may be conductively connected (electrically and thermally) to the embedded circuit component 110 through the conductive coin 304.

In some examples, the example substrate 300 may include one or more additional dielectric layers and/or conductive layers (not shown) formed on one or both of the top side and/or bottom side of the structure shown in FIG. 3, e.g., defining respective conductive pathways for conducting electrical signals to and from the embedded circuit component 110 and for transferring heat from the embedded circuit component 110 (e.g., toward a heat sink or other thermal management structure or system thermally coupled to the substrate 300).

Respective conductive elements of the example substrate 300, for example including conductive structures formed in conductive layer 306, 316 and/or 320, conductive vias 318 and/or 319, and/or conductive coin 304, may define electrically connections between respective elements provided in the embedded circuit component 110 and external circuitry (not shown) mounted on, or to, the substrate 300. For example, respective conductive elements of the example substrate 300 may define (a) a first electrical connection, through the conductive via (e.g., micro-via) 318, connecting first external circuitry (not shown) at a top side of the embedded circuit component 110 to a first element or component of the embedded circuit component 110 and (b) a second electrical connection, through the first conductive layer 306 (and optionally through the conductive coin 304 and third conductive layer 320), connecting second respective external circuitry (not shown) at a bottom side of the embedded circuit component 110 substrate 300 to a second element or component of the embedded circuit component 110.

Figure 4A:
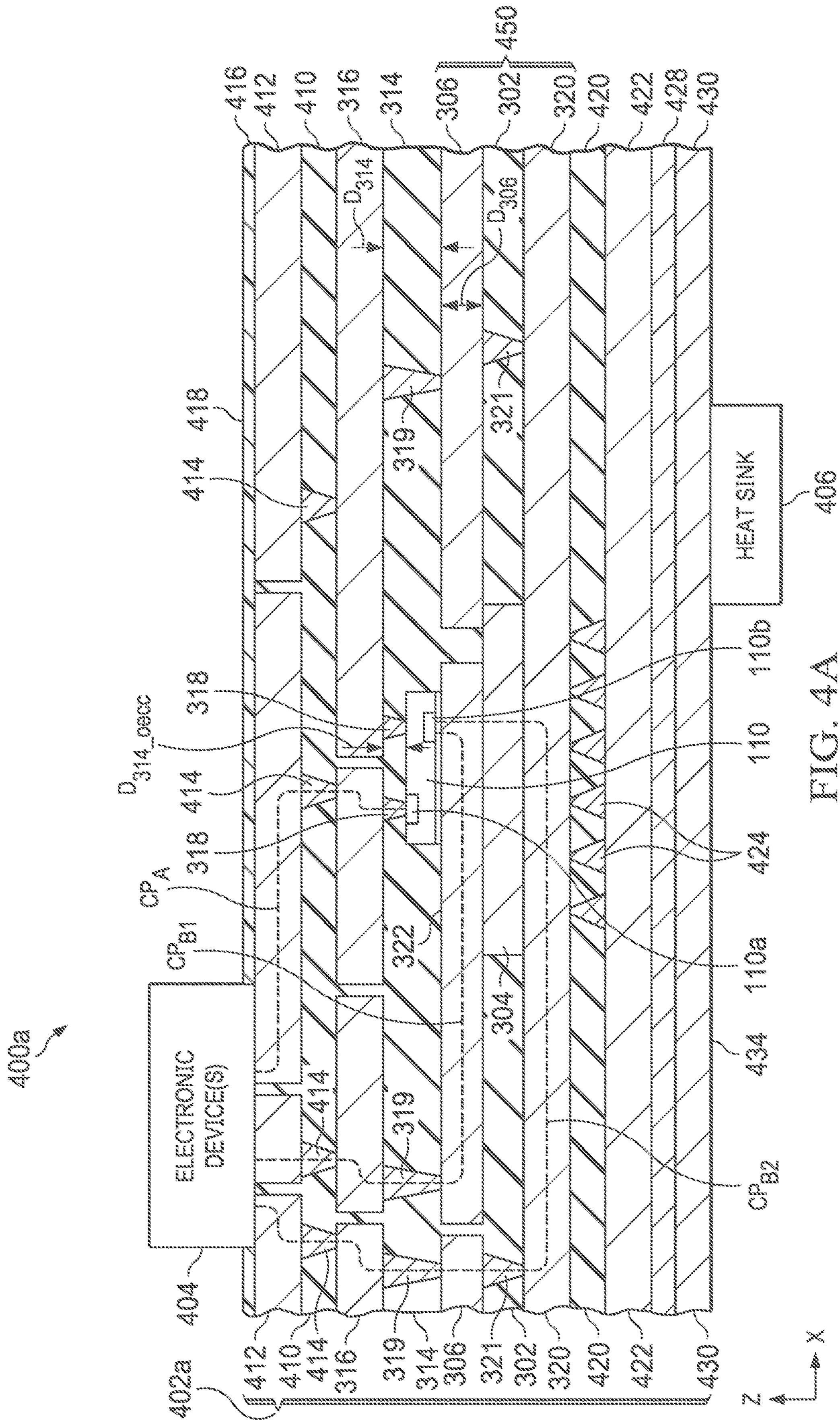
FIG. 4A is a cross-sectional side view of an example IC package including the example embedded component substrate corresponding with the example substrate shown in FIG. 3, with electronic device(s) and a heat sink mounted thereon, according to one example.

FIG. 4A is a cross-sectional side view of an example IC package 400*a* including an example embedded component substrate 402*a* (or substrate 402*a*), at least one electronic device 404 mounted on a first side 418 of the substrate 402*a*, and a heat sink 406 mounted on a second side 434 of the substrate 402*a*. The example substrate 402*a* includes the elements of the example embedded component substrate 300 shown in FIG. 3, along with additional elements discussed below.

Accordingly, the example substrate 402*a* includes the first dielectric layer 302, the conductive coin 304 embedded in the first dielectric layer 302, the first conductive layer 306 formed on the first side of the first dielectric layer 302, the embedded circuit component 110 mounted on the first conductive layer 306 (e.g., using optional bond 111), the second dielectric layer 314 formed over the first conductive layer 306, the second conductive layer 316 formed over the second dielectric layer 314, and the third conductive layer 320 formed on the second side of the first dielectric layer 302 (the bottom side in the example orientation shown in FIG. 4A) and in some examples conductively connected to the embedded circuit component 110 through the conductive coin 304 and first conductive layer 306.

In some examples, the first dielectric layer 302 including the conductive coin 304 embedded therein, the first conductive layer 306 formed on the first side of the first dielectric layer 302, and the third conductive layer 320 formed on the second side of the first dielectric layer 302, may collectively define a substrate core 450, which may be formed using any suitable process. The embedded circuit component 110 may be mounted to the substrate core 450, e.g., mounted on the first conductive layer 306 as discussed above, and the further dielectric and conductive layers of the substrate 400*a* (e.g., layers 314, 316, 410, 412, 418, 420, 422, 428, and 430 discussed below) may be respectively formed on opposing sides (e.g., top and bottom sides in the orientation shown in FIG. 4A) of the substrate core 450.

On the top side of the substrate core 450 (in the example orientation shown in FIG. 4A), the substrate 402*a* includes multiple conductive vias 318 and 319 extending through the second dielectric layer 314, wherein (a) the conductive vias 318 (e.g., micro-vias) extend vertically through the second dielectric layer thickness $D_{314\_oecc}$ at locations over the embedded circuit component 110 to conductively connect the second conductive layer 316 to the embedded circuit component 110, and (b) the conductive vias 319 (e.g., blind vias or drilled vias) extend vertically through the second dielectric layer thickness $D_{314}$ at locations laterally spaced apart from the embedded circuit component 110 to conductively connect the second conductive layer 316 to the first conductive layer 306. In some examples, conductive vias 318 may comprise micro-vias, having a vertical (z-direction) depth $D_{118}$ of less than 250 μm, less than less than 150 μm, or less than 100 μm.

The example substrate 402*a* also includes a third dielectric layer 410 formed over the second conductive layer 316, a fourth conductive layer 412 formed over the third dielectric layer 410, and a plurality of conductive vias (e.g., micro-vias) 414 conductively connecting the fourth conductive layer 412 with the underlying second conductive layer 316. In some examples, a top coating 416, e.g., comprising an acrylic resin or polymeric film, is formed over the fourth conductive layer 412. The top coating 416 may define the first side 418 of the substrate 402*a*.

On the bottom side of the substrate core 450 (in the example orientation shown in FIG. 4A), the substrate 402*a* may include thermally conductive structures for transferring heat from the embedded circuit component 110 to the heat sink 406 mounted on the second side 434 of the substrate 402*a*. For example, below the embedded circuit component 110, the example substrate 402*a* may include a fourth dielectric layer 420 formed under the third conductive layer 320, a fifth conductive layer 422 formed under the fourth dielectric layer 420, a thermally conductive pre-preg layer 428 formed under the fifth conductive layer 422, and a sixth conductive layer 430 formed under the thermally conductive pre-preg layer 428 defining the second side 434 of the substrate 402*a*. The term formed under is based on the example orientation shown in FIG. 4A, whereas in production the orientation may be reversed, so that the respective fourth dielectric layer 420, fifth conductive layer 422, thermally conductive pre-preg layer 428 and sixth conductive layer 430 may be formed over the respective underlying layers. An array of conductive vias 424 may conductively connect the fifth conductive layer 422 with the third conductive layer 320. In this manner, the heat sink 406 is thermally coupled to the embedded circuit component 110 through the conductive coin 304, third conductive layer 320, conductive vias 424, fifth conductive layer 422, thermally conductive pre-preg layer 428, and sixth conductive layer 430.

At least one electronic device 404 (e.g., comprising any electronic circuitry) may be mounted to or secured on the first side 418 of the substrate 402*a*, and may be electrically connected to the embedded circuit component 110 through conductive paths defined by respective conductive elements of the substrate 402*a*, for example one or more of the conductive layers 306, 316, 320 and/or 412, conductive vias 318, 319, 414, and/or 321, and/or the conductive coin 304. For example, the at least one electronic device 404 may include (a) first respective circuitry electrically connected to a respective first element 110*a* of the embedded circuit component 110 through a conductive path $CP_A$ passing through respective elements of conductive layers 412 and 316 and respective vias 414 and 318, and (b) second respective circuitry electrically connected to a respective second element 110*b* of the embedded circuit component 110 through either (1) a conductive path $CP_{B1}$ passing through respective elements of conductive layers 412, 316, and 306 and respective vias 414 and 319, or (2) a conductive path $CP_{B2}$ passing through respective elements of conductive layers 412, 316, 306, and 320, respective vias 414, 319, and 321, and the conductive coin 304.

Figure 4B:
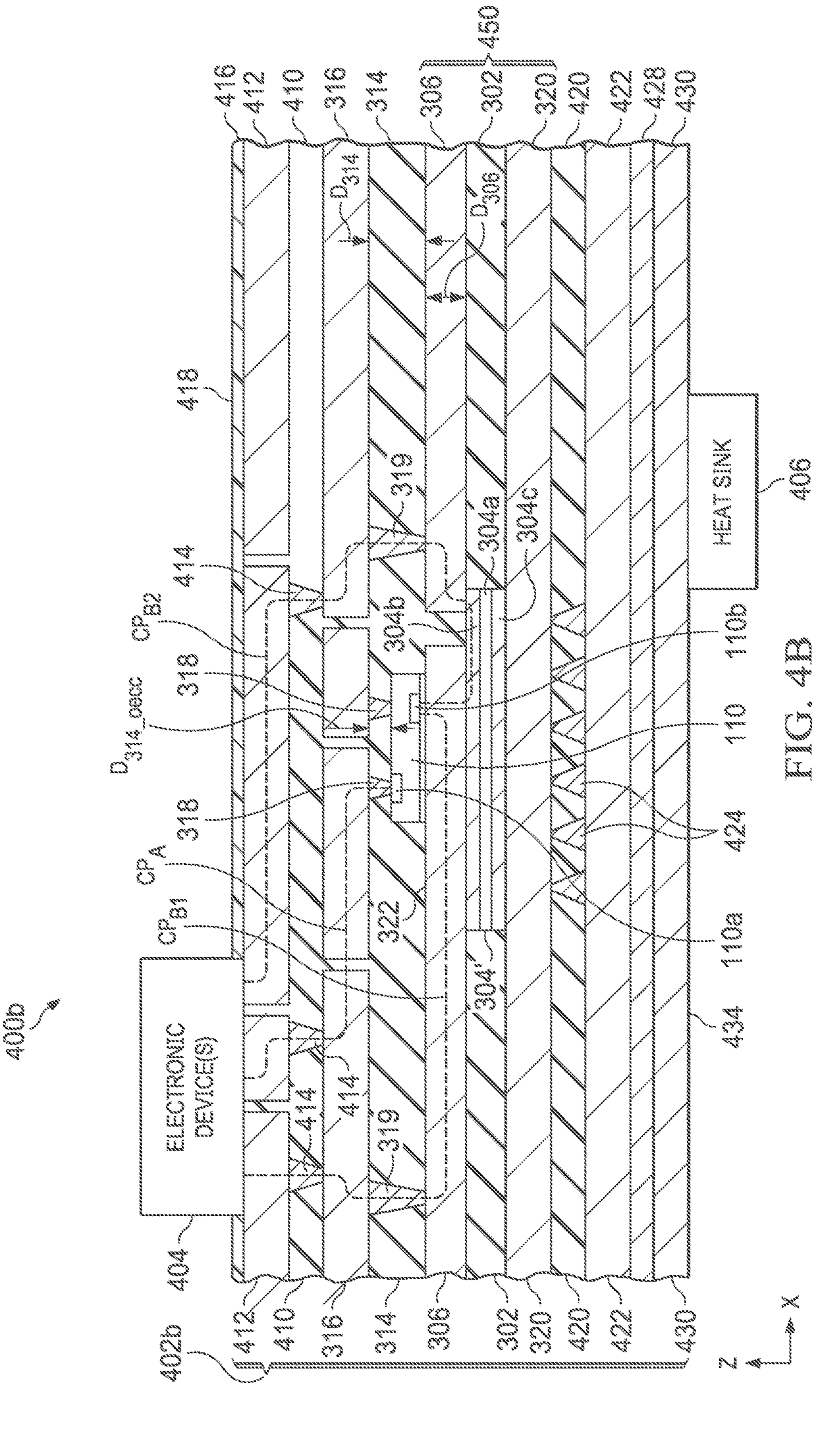
FIG. 4B is a cross-sectional side view of an example IC package similar to the example IC package of FIG. 4A, but including a conductive coin including a thermally conductive, electrically nonconductive component, according to one example.

FIG. 4B is a cross-sectional side view of an example IC package 400*b* including an example embedded component substrate 402*b* (or substrate 402*b*), at least one electronic device 404 mounted on a first side 418 of the substrate 402*b*, and a heat sink 406 mounted on a second side 434 of the substrate 402*b*. The example substrate 402*b* is generally similar to the example substrate 402*a* shown in FIG. 4A and discussed above. However, instead of the conductive coin 304 incorporated in the example substrate 402*a*, which may comprise a solid metal mass, substrate 402*b* includes an example conductive coin 304' comprising a thermally conductive, electrically nonconductive component to electrically isolate the embedded circuit component 110 from conductive structures below the conductive coin 304' (i.e., conductive structures on the opposite side of the conductive coin 304' from the embedded circuit component 110), while allowing heat transfer through the vertical thickness of the conductive coin 304', e.g., to transfer heat from the embedded circuit component 110 to a heat sink 206 or other heat transfer structure or device.

As shown in FIG. 4B, the example conductive coin 304' includes a thermally conductive, electrically nonconductive component 304*a* arranged between a first metal component 304*b* and a second metal component 304*c*. The conductive coin 304' may be similar to the conductive coin 104' and discussed above with reference to FIG. 2C. Accordingly, the thermally conductive, electrically nonconductive component 304*a*, first metal component 304*b*, and second metal component 304*c* of conductive coin 304' may be similar to the thermally conductive, electrically nonconductive component 104*a*, first metal component 104*b*, and second metal component 104*c*, respectively, of conductive coin 104' discussed above. Further, the first metal component 304*b* and a second metal component 304*c* on opposing sides of the thermally conductive, electrically nonconductive component 304*a* may comprise any suitable metal with any suitable form and thickness.

In some examples, the first metal component 304*b* and a second metal component 304*c* on opposing sides of the thermally conductive, electrically nonconductive component 304*a* may allow direct metal plating on both the first side (top side) and second side (bottom side) of the conductive coin 304', e.g., to allow plating (e.g., copper plating) directly of the first conductive layer 306 on the first side (top side) of the conductive coin 304' and plating (e.g., copper plating) of the third conductive layer 320 directly on the first side (top side) of the conductive coin 304'.

As shown in FIG. 4B, due to the presence of the thermally conductive, electrically nonconductive component 304*a* to electrically isolate the embedded circuit component 110 from structures below the conductive coin 304', the thermally conductive, electrically nonconductive pre-preg layer 428 included in substrate 202*a* shown in FIG. 4A (discussed above) may optionally be omitted.

In the example shown in FIG. 4B, the at least one electronic device 404 (e.g., comprising any electronic circuitry) may be electrically connected to the embedded circuit component 110 through conductive paths defined by respective conductive elements of the substrate 402*a*, for example one or more of the conductive layers 306, 316, 320 and/or 412, conductive vias 318, 319, 414, and/or 321, and/or the conductive coin 304' (e.g., the first metal component 304*b* of the conductive coin 304'). For example, the at least one electronic device 404 may include (a) first respective circuitry electrically connected to a respective first element 110*a* of the embedded circuit component 110 through a conductive path $CP_A$ passing through respective elements of conductive layers 412 and 316 and respective vias 414 and 318, and (b) second respective circuitry electrically connected to a respective second element 110*b* of the embedded circuit component 110 through either (1) a conductive path $CP_{B1}$ passing through respective elements of conductive layers 412, 316, and 306 and respective vias 414 and 319, or (2) a conductive path $CP_{B2}$ passing through respective elements of conductive layers 412, 316, and 306, respective vias 414 and 319, and the first metal component 304*b* of the conductive coin 304'.

Figure 5A:
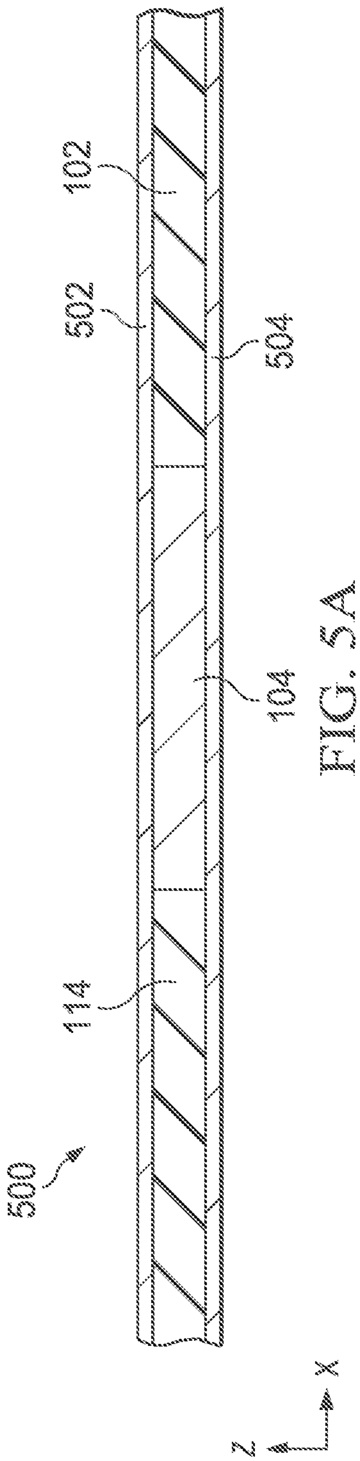
FIGS. 5A-5G are a series of cross-sectional side views showing an example method of forming an example IC package including an embedded component substrate including an embedded component mounted in a cavity of a conductive layer over a conductive coin, according to one example.

FIGS. 5A-5G show a series of cross-sectional side views showing an example method of forming the example IC package 200*a* shown in FIG. 2A (or alternatively the example IC package 200*b* shown in FIG. 2B) and discussed above. As shown in FIG. 5A, a starter core 500 is formed, which may include the conductive coin 104 embedded in the first dielectric layer 102 (which may be referred to as the core dielectric), a first metal foil layer 502 (e.g., a copper foil) formed on a first side of the first dielectric layer 114, and a second metal foil layer 504 (e.g., a copper foil) formed on a second side of the first dielectric layer 114. The metal foil layer 502 and/or metal foil layer 504 may extend over respective sides of the conductive coin 104, or alternatively respective sides of the conductive coin 104 may be exposed through the metal foil layer 502 and/or metal foil layer 504, depending on the method used to form the starter core 500. In either case, the conductive coin 104 is arranged as a "through coin," i.e., wherein the conductive coin 104 is conductively contactable from the first side and from the second side of the starter core 500. FIGS. 7A-7D discussed below show one example process of forming the starter core 500.

Figure 5B:
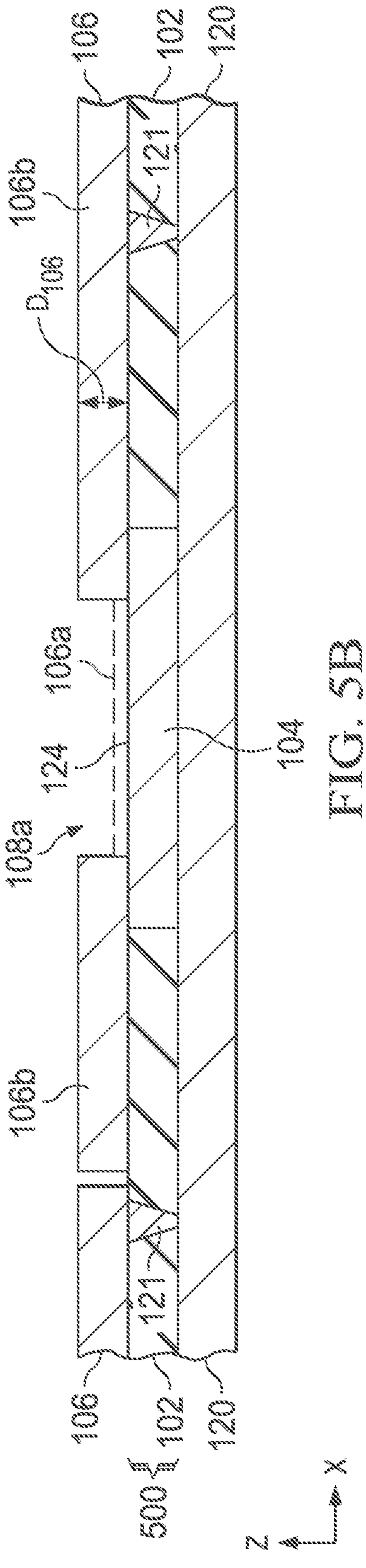

As shown in FIG. 5B, the first conductive layer 106 including the cavity 108*a* may be formed on the first side (top side in the orientation shown in FIG. 5B) of the starter core 500, and the second conductive layer 120 may be formed on the second side (bottom side in the orientation shown in FIG. 5B) of the starter core 500. In one example, the first conductive layer 106 may be formed by a plating process (e.g., copper plating) on the first metal foil layer 502 (e.g., copper foil) to build up the first conductive layer 106 to a desired thickness, and the second conductive layer 120 may be formed by a plating process (e.g., copper plating) on the second metal foil layer 504 (e.g., copper foil) to build up the second conductive layer 120 to a desired thickness. First metal foil layer 502 may be considered part of first conductive layer 106 and second metal foil layer 504 may be considered part of second conductive layer 120. Conductive tracks or traces may be etched into the first conductive layer 106 and/or the second conductive layer 120.

The first conductive layer 106 including the cavity 108*a* may be formed in any suitable manner, e.g., including additive and/or subtractive processes. In some examples, the first conductive layer 106 may be formed by an additive process including at least (a) masking an area corresponding with the resulting cavity 108*a*. (c) forming the first conductive layer 106 (e.g., including regions 106*b* shown in FIG. 5B) by copper plating or other additive deposition process, and (c) removing the mask to define the cavity 108*a*.

In examples that include a reduced thickness region 106*a* of the first conductive layer 106 (on which reduced thickness region 106*a* the embedded circuit component 110 is subsequently mounted), the first conductive layer 106 may be formed by an additive process including at least (a) forming an initial layer or thickness of the first conductive layer 106, having a reduced thickness region 106*a*, over the starter core 500, e.g., by copper plating or other deposition process, (b) forming or arranging a mask over the reduced thickness region 106*a* in an area corresponding with the resulting cavity 108*a*. (c) forming the remaining thickness of the first conductive layer 106 over the reduced thickness region 106*a* (e.g., including regions 106*b* shown in FIG. 5B) by copper plating or other additive deposition process, and (d) removing the mask to define the cavity 108*a* over the reduced thickness region 106*a*.

In some examples, the cavity 108*a* may be formed by a subtractive process. For example, first conductive layer 106 including the cavity 108*a* may be formed by a process including (a) depositing the first conductive layer 106, and (b) etching or machining the cavity 108*a* in the first conductive layer 106. In some examples, the cavity 108*a* may be etched or machined down through the full thickness $D_{106}$ of the first conductive layer 106 to expose the top surface 124 of the conducive coin 104, e.g., as discussed above regarding the examples shown in FIGS. 1A and 2A. Alternatively, e.g., as discussed above, the cavity 108*a* may be etched or machined only partially through the thickness $D_{106}$ of the first conductive layer 106 (e.g., as represented by cavity 108*b* shown in FIGS. 1B and 2B), leaving the reduced thickness region 106*a* of the first conductive layer 106 indicated in FIG. 5B by a dashed line.

In some examples, optional conductive vias 121 may be formed through the first dielectric layer 102 to electrically connect the first conductive layer 106 to the third conductive layer 120. The optional conductive vias 121 may be formed as micro-vias, blind-hole vias, or drilled vias, for example.

Figure 5C:
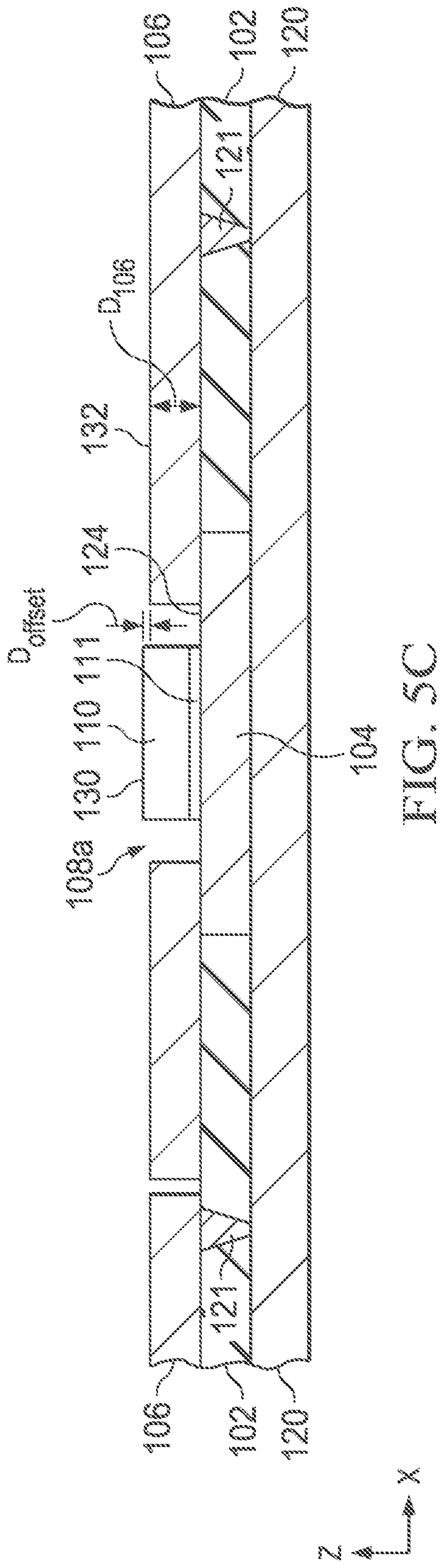

As shown in FIG. 5C, in an example in which the cavity 108*a* extends through the full thickness $D_{106}$ of the first conductive layer 106, the embedded circuit component 110 may be mounted on the exposed top surface 124 of the conducive coin 104, e.g., using a die or component attach processes including bond 111. Alternatively, in an example in which the cavity extends only partially through the thickness $D_{106}$ of the first conductive layer 106 (e.g., cavity 108*b* shown in FIGS. 1B and 2B), the embedded circuit component 110 may be mounted on the reduced thickness region 106*a* of the first conductive layer 106. Although this alternative example is not explicitly shown in FIGS. 5C-5G, one of ordinary skill in the art would understand the process shown in FIGS. 5C-5G may similarly apply to the alternative example in which the cavity (e.g., cavity 108*b*) extends only partially through the thickness $D_{106}$ of the first conductive layer 106, and the embedded circuit component 110 is mounted on the reduced thickness region 106*a*.

As discussed above with reference to FIGS. 1A and 1B, the embedded circuit component top surface 130 may be flush (co-planar) or substantially flush with the first conductive layer top surface 132 at a location laterally outside the cavity 108*a*. For example, the vertical offset $D_{offset}$ between the embedded circuit component top surface 130 and the first conductive layer top surface 132 may be less than 50% or less than 25% of the depth $D_{106}$ of the first conductive layer 106 at a location laterally outside the cavity 108*a*. In some examples, the vertical offset $D_{offset}$ is less than 150 μm, less than 100 μm, or less than 50 μm. In some examples, the vertical offset $D_{offset}$ may be controlled by forming the first conductive layer 106 with a depth $D_{106}$ selected based on the thickness (z-direction) of the embedded circuit component 110.

Figure 5D:
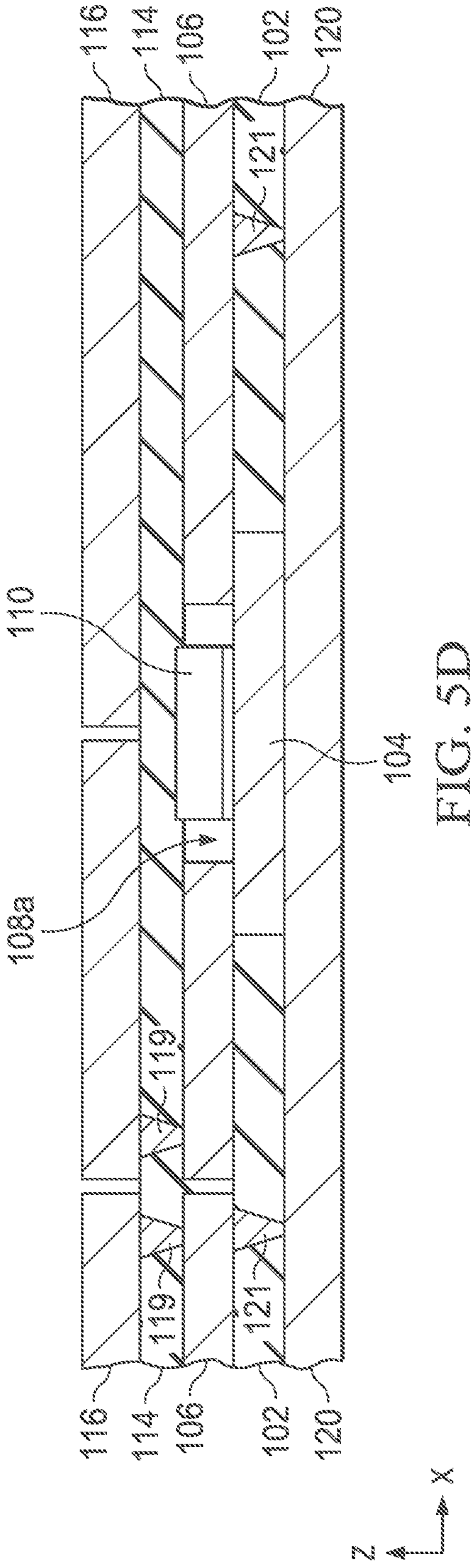

As shown in FIG. 5D, the second dielectric layer 114 is formed on the first conductive layer 106 and extending over embedded circuit component 110. In some examples, the second dielectric layer 114 may be formed by depositing one or more dielectric material layers (e.g., pre-impregnated glass-fiber fabric (prepreg) layers or filled resin sheets) over the first conductive layer 106 and embedded circuit component 110.

After forming the second dielectric layer 114, the second conductive layer 116, e.g., a copper layer, may be formed on the second dielectric layer 114.

Figure 5E:
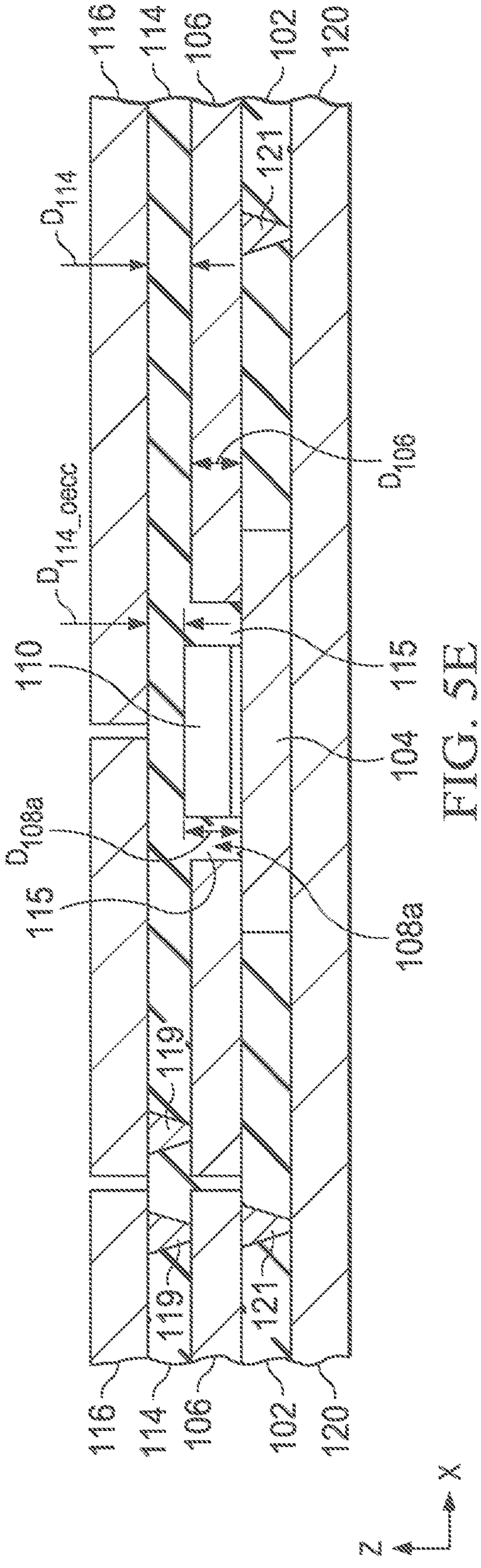

As shown in FIG. 5E, a lamination process may be performed, wherein heat and pressure are applied to the stacked structure, which may (a) bind the second conductive layer 116 to the second dielectric layer 114 and (b) cause material of the second dielectric layer 114 (e.g., epoxy resin of one or more pre-preg layers) to flow into areas 115 of the cavity 108*a* to encapsulate the embedded circuit component 110.

Figure 5F:
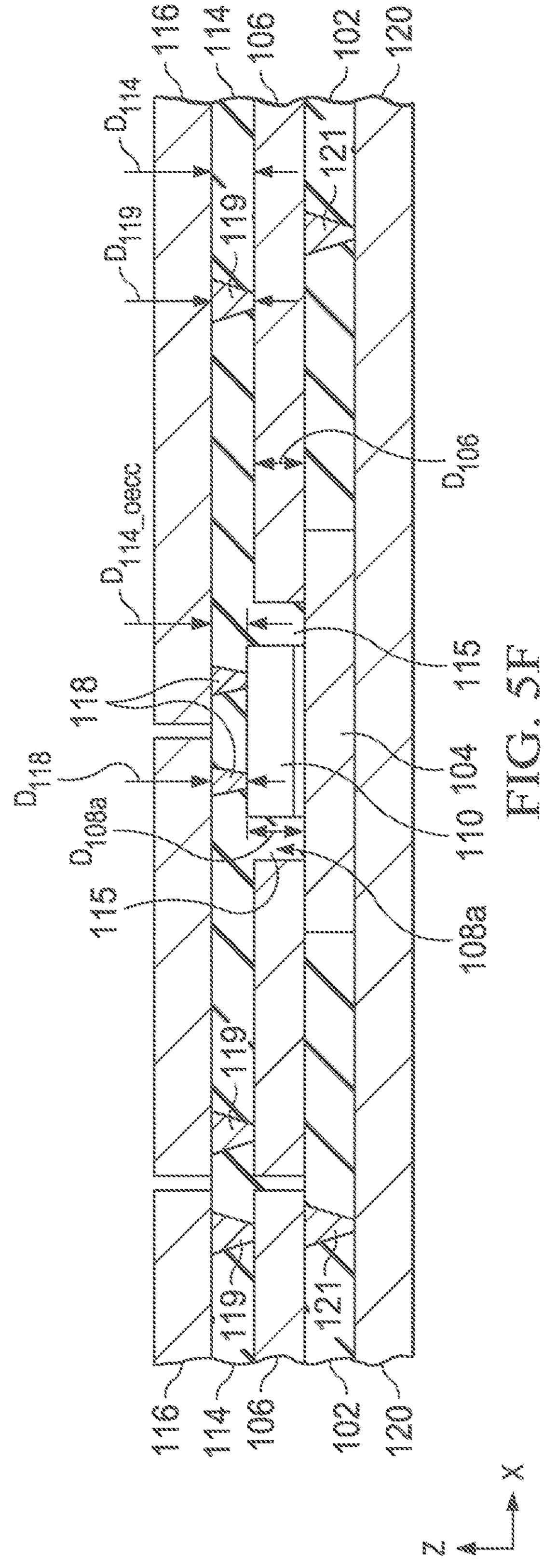
Figure 5G:
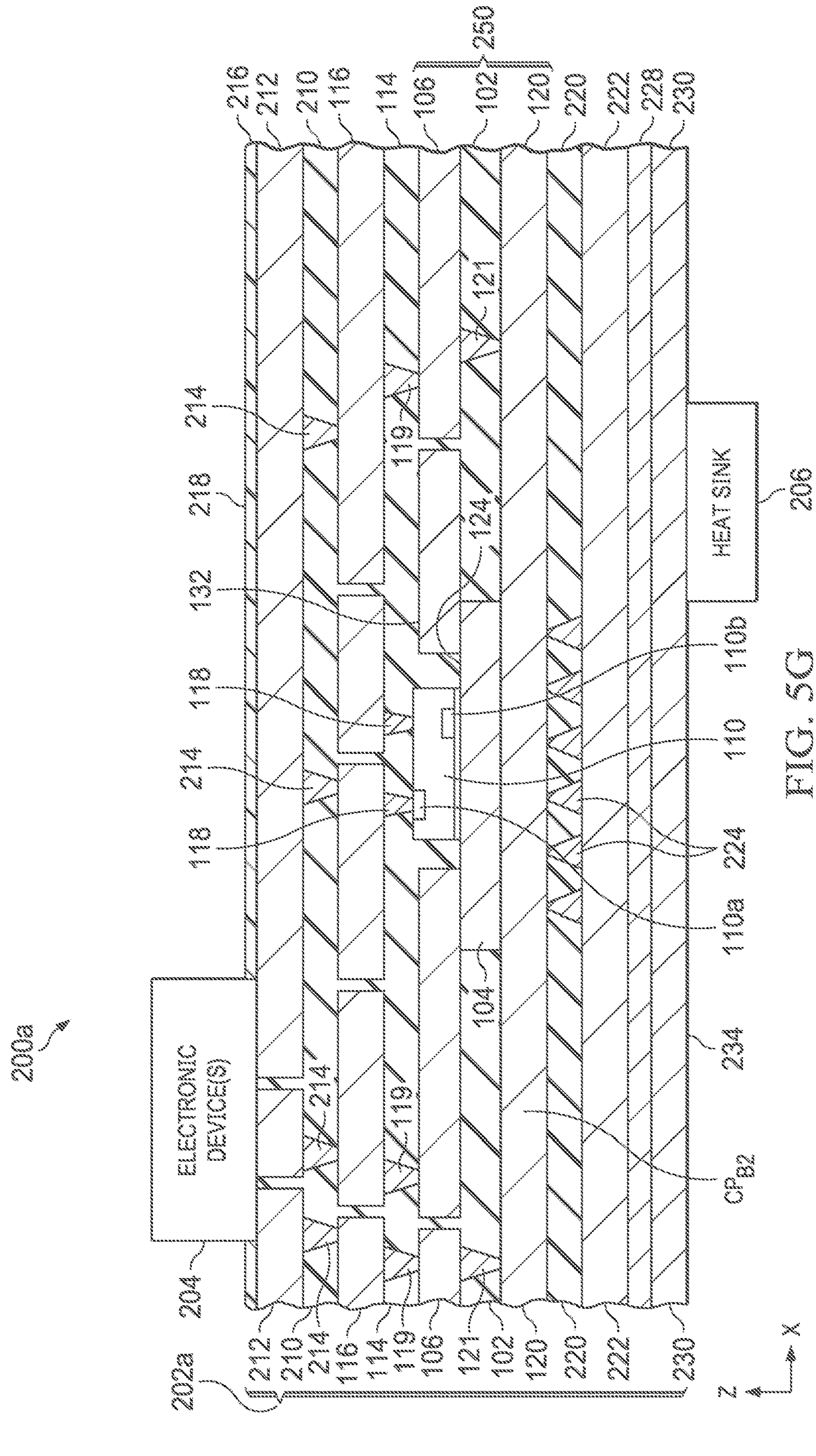

As shown in FIG. 5F, conductive vias 118 and 119 may be formed. In some examples, for example where conductive vias 118 and 119 are formed as micro-vias, conductive vias 118 and 119 may be formed by a process including (a) mechanically or laser drilling or ablating respective openings through conductive layer 116 and underlying dielectric layer 114 and down to respective conductive elements, e.g., conductive terminals or contacts at the top of the embedded circuit component 110 (for conductive vias 118 being formed) and the first conductive layer 106 (for conductive vias 119 being formed), and (b) plating the respective drilled/ablated openings with copper (or other suitable metal) to form electrically conductive connections between the second conductive layer 116 and embedded circuit component 110 (i.e., conductive vias 118) and between the second conductive layer 116 and the first conductive layer 106 (i.e., conductive vias 119). In some examples, the conductive vias 118 and 119 may comprise micro-vias having respective depths $D_{118}$ and $D_{119}$ of less than 250 μm, less than less than 150 μm, or less than 100 μm.

The conductive vias 118 may conductively connect (e.g., electrically and thermally) the second conductive layer 116 to the embedded circuit component 110, and the conductive vias 119 may conductively connect (e.g., electrically and thermally) the second conductive layer 116 to the first conductive layer 106, e.g., to define an electrical connection to the embedded circuit component 110 through the conductive coin 104.

As shown in FIG. 5F, remaining structures of the example IC package 200*a* are formed. For example, the third dielectric layer 210, fourth conductive layer 212, and top coating 216 (e.g., comprising an acrylic resin or polymeric film) may be formed over the second conductive layer 116. In addition, the fourth dielectric layer 220, fifth conductive layer 222, thermally conductive, electrically nonconductive pre-preg layer 228, and sixth conductive layer 230 may be formed on a bottom side of the third conductive layer 120.

At least one electronic device 204 (e.g., comprising any electronic circuitry) may be mounted to or secured on the first side 218 of the substrate 202*a*, and may be electrically connected to the embedded circuit component 110 through conductive paths defined by respective conductive elements of the substrate 202*a*, for example one or more of the conductive layers 106, 116, 120 and/or 212, conductive vias 118, 119, and/or 214, and/or the conductive coin 104. For example, the at least one electronic device 204 may include (a) first respective circuitry electrically connected to a respective first element 110*a* of the embedded circuit component 110 through a respective conductive via (e.g., micro-via) 118 (in combination with other conductive elements formed in the substrate 202*a*), and (*b*) second respective circuitry electrically connected to a respective second element 110*b* of the embedded circuit component 110 through the conductive coin 104 (in combination with other conductive elements formed in the substrate 202*a*).

Figure 6A:
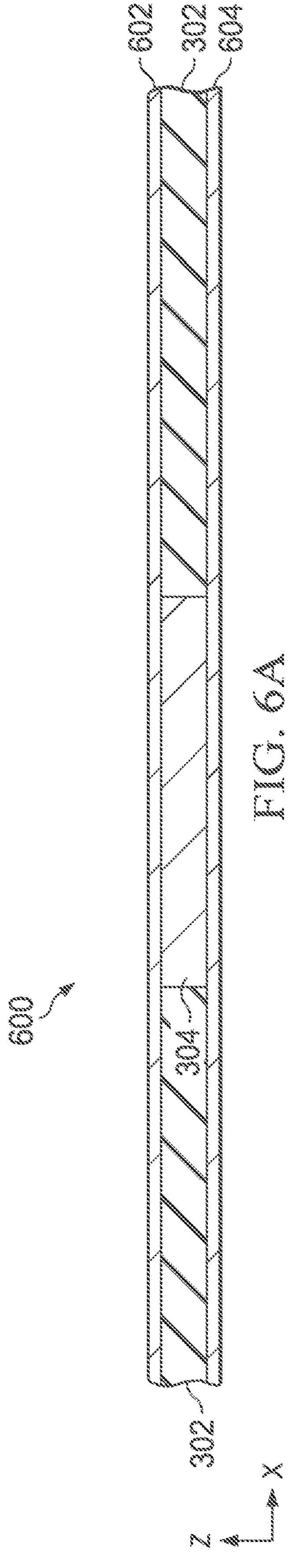
FIGS. 6A-6H are a series of cross-sectional side views showing an example method of forming an example IC package including an embedded component substrate including an embedded component mounted on a conductive layer over a conductive coin, according to one example.

FIGS. 6A-6H show a series of cross-sectional side views showing an example method of forming the example IC package 400*a* including substrate 402*a* shown in FIG. 4A and discussed above. As shown in FIG. 6A, a starter core 600 is formed, including a conductive coin 304 embedded in a first dielectric layer 302, and a first metal foil layer 602 (e.g., a copper foil) and a second metal foil layer 604 (e.g., a copper foil) formed on opposing sides of the first dielectric layer 304. The starter core 600 may be the same or similar to the example starter core 500 discussed above with reference to FIG. 5A, and in some examples may be formed according to the example process shown in FIGS. 7A-7D, discussed below.

Figure 6B:
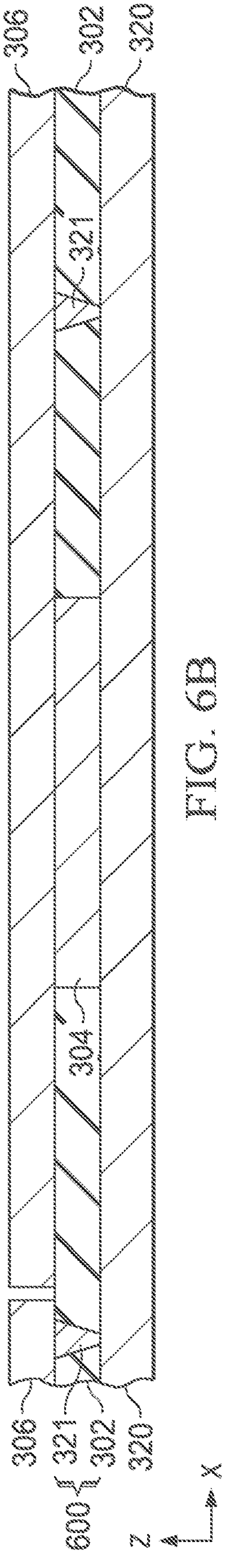

As shown in FIG. 6B, the first conductive layer 306 may be formed on the first side (top side in the orientation shown in FIG. 6B) of the starter core 600, and the third conductive layer 320 may be formed on the second side (bottom side in the orientation shown in FIG. 6B) of the starter core 600. In one example, the first conductive layer 306 may be formed by a plating process (e.g., copper plating) on the first metal foil layer 602 (e.g., copper foil) to build up the first conductive layer 306 to a desired thickness, and the third conductive layer 320 may be formed by a plating process (e.g., copper plating) on the second metal foil layer 604 (e.g., copper foil) to build up the third conductive layer 320 to a desired thickness. The first metal foil layer 602 may be considered part of first conductive layer 306 and the second metal foil layer 604 may be considered part of third conductive layer 320. Conductive tracks or traces may be etched into the first conductive layer 306 and/or the third conductive layer 320.

In some examples, optional conductive vias 321 may be formed through the first dielectric layer 302 to electrically connect the first conductive layer 306 to the third conductive layer 320. The optional conductive vias 321 may be formed as micro-vias, blind-hole vias, or drilled vias, for example.

Figure 6C:
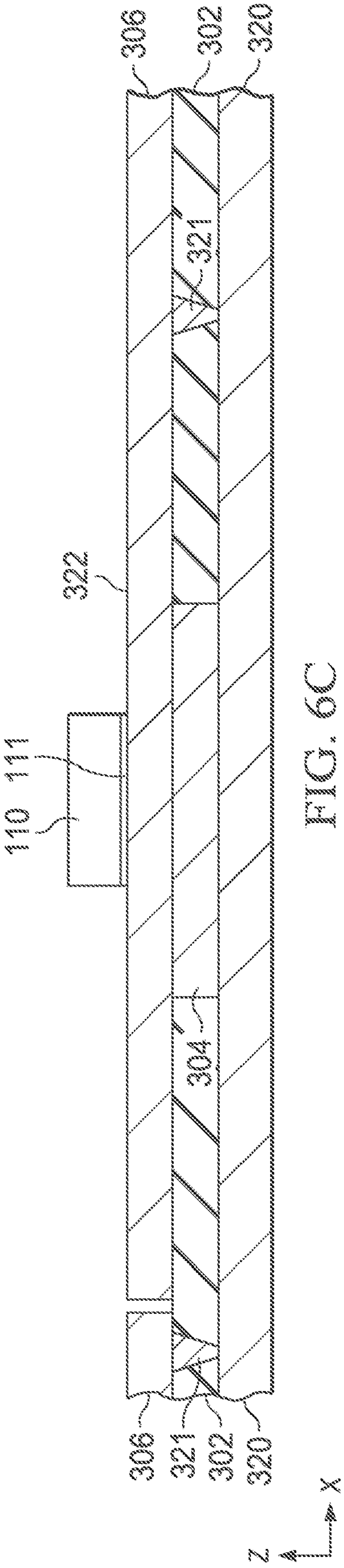

As shown in FIG. 6C, the embedded circuit component 110 may be mounted on the top surface 322 of the first conductive layer 306, e.g., using a die or component attach processes including bond 111.

Figure 6D:
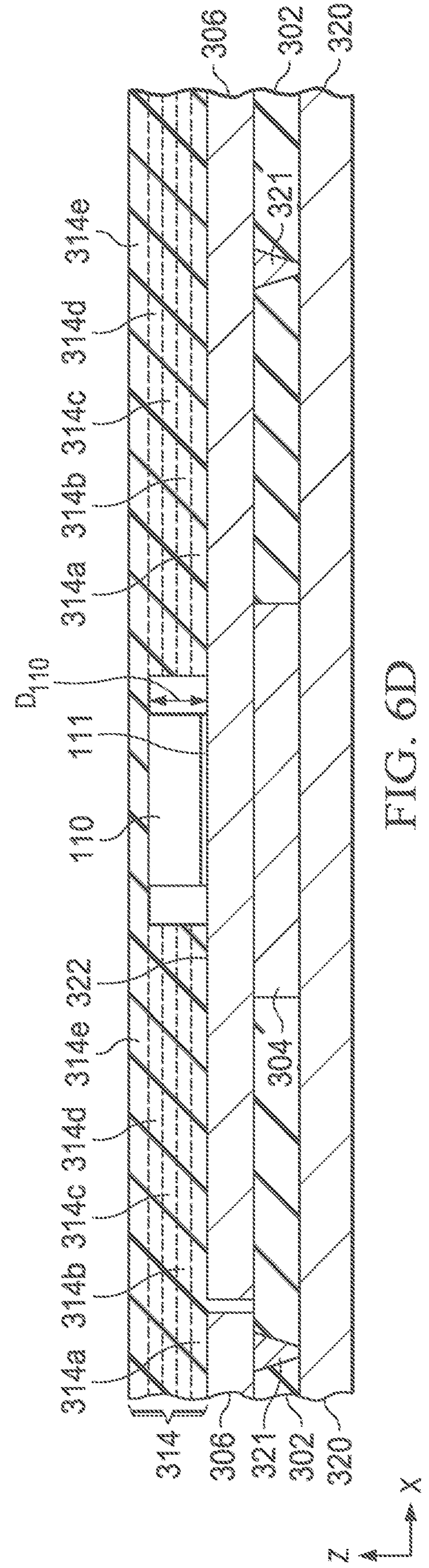
Figure 6E:
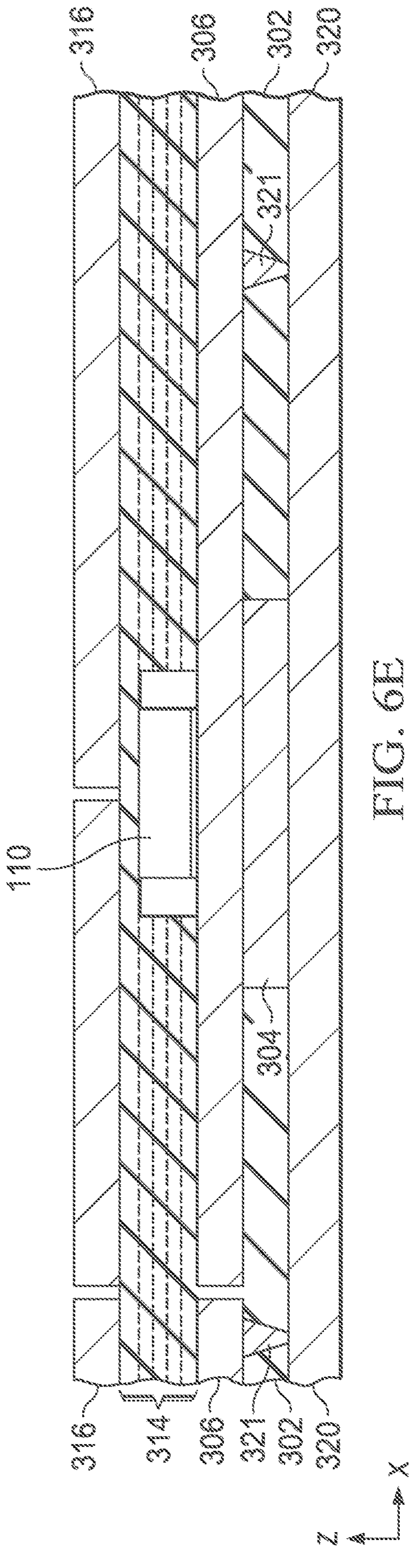

The second dielectric layer 314 may be formed over the first conductive layer 306 and extending over the mounted embedded circuit component 110, e.g., by the example process shown in FIGS. 6D and 6E or a similar process. As shown in FIG. 6D, a series of first dielectric material layers (e.g., prepreg layers or filled resin sheets), indicated at 314*a*-314*d* may be arranged over the first conductive layer 306, wherein the first dielectric material layers 314*a*-314*d* may include respective openings through which the embedded circuit component 110 may project. One or more second dielectric material layers 314*e* may then be arranged over the first dielectric material layers 314*a*-314*d* (e.g., on top of the first dielectric material layers 314*d* in the example shown in FIG. 6D) and extending over the embedded circuit component 110. The dielectric material layers 314*a*-314*e* may collectively define the second dielectric layer 314, as shown in FIG. 6D.

As shown in FIG. 6E, the second conductive layer 316 is formed over the second dielectric layer 314, e.g., by a copper plating process.

Figure 6F:
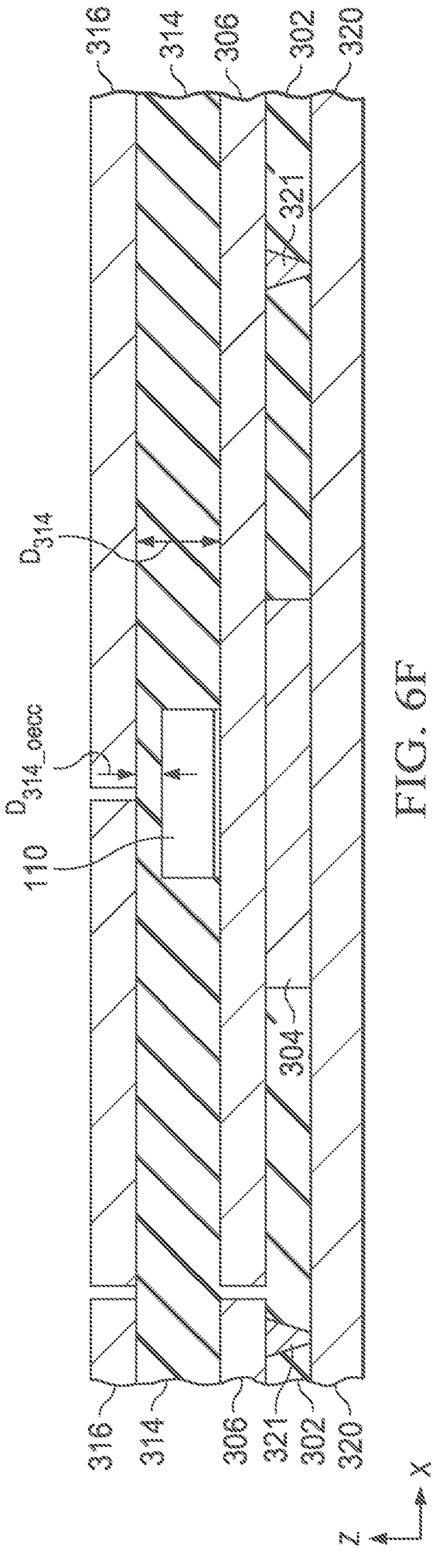

As shown in FIG. 6F, a lamination process may be performed, wherein heat and pressure are applied to the stacked structure, which may (a) bind the second conductive layer 316 to the second dielectric layer 314 and (b) cause material of the second dielectric layer 314 (e.g., epoxy resin of one or more pre-preg layers) to flow around and encapsulate the embedded circuit component 110.

Figure 6G:
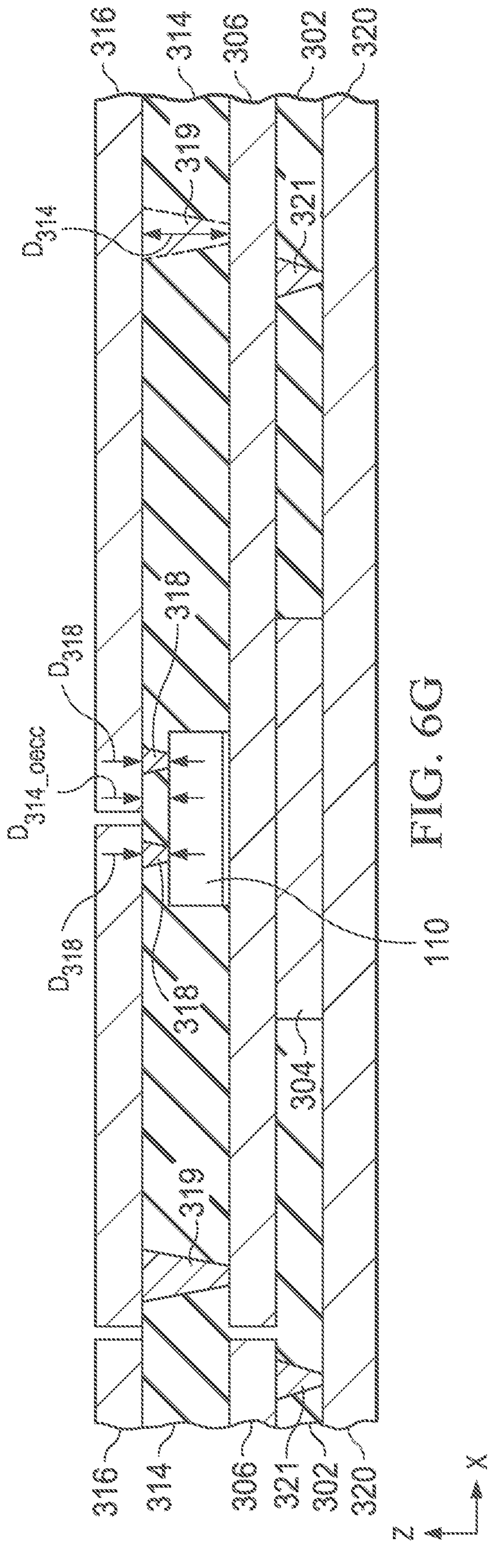

As shown in FIG. 6G, conductive vias 318 and 319 may be formed, e.g., concurrently or by separate processes. In some examples, conductive vias 318 are formed as micro-vias, while conductive vias 319 are formed as formed as blind vias or drilled vias. Conductive vias 318 may be formed as micro-vias by a process including (a) mechanically or laser drilling or ablating respective openings through second conductive layer 316 and underlying second dielectric layer 314 and down to respective conductive terminals or contacts at the top of the embedded circuit component 110, and (b) plating the respective drilled/ablated openings with copper (or other suitable metal) to form electrically conductive connections between the second conductive layer 316 and the embedded circuit component 110.

In some examples, the conductive vias 318 may comprise micro-vias having respective depths $D_{318}$ of less than 250 μm, less than less than 150 μm, or less than 100 μm.

Figure 6H:
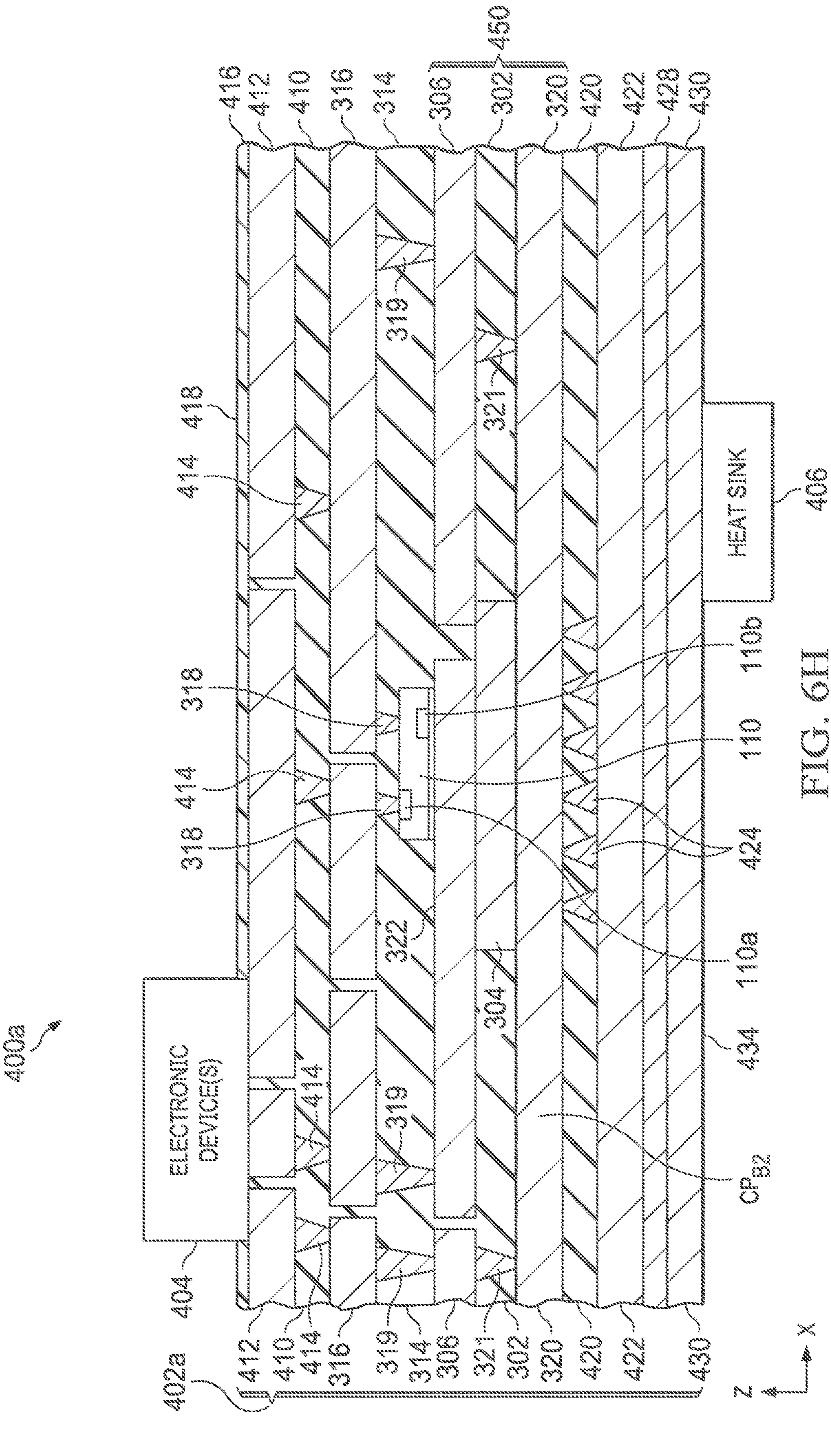

As shown in FIG. 6H, remaining structures of the example IC package 400*a* may be formed. For example, substrate 402*a* may be further formed by forming the third dielectric layer 410, fourth conductive layer 412, and top coating 416 (e.g., comprising an acrylic resin or polymeric film) over the second conductive layer 316, and forming the fourth dielectric layer 420, fifth conductive layer 422, thermally conductive pre-preg layer 428, and sixth conductive layer 430 on a bottom side of the third conductive layer 320.

At least one electronic device 404 (e.g., comprising any electronic circuitry) may be mounted to or secured on the first side 418 of the substrate 402*a*, and may be electrically connected to the embedded circuit component 110 through conductive paths defined by respective conductive elements of the substrate 402*a*, for example one or more of the conductive layers 306, 316, 320 and/or 412, conductive vias 318 and/or 319, and/or the conductive coin 304. For example, the at least one electronic device 404 may include (a) first respective circuitry electrically connected to a respective first element 110*a* of the embedded circuit component 110 through a respective conductive via (e.g., micro-via) 318 (in combination with other conductive elements formed in the substrate 402*a*), and (*b*) second respective circuitry electrically connected to a respective second element 110*b* of the embedded circuit component 110 through the conductive coin 304, the third conductive layer 320 below the coin 304, and other conductive elements formed in the substrate 402*a*.

Figure 7A:
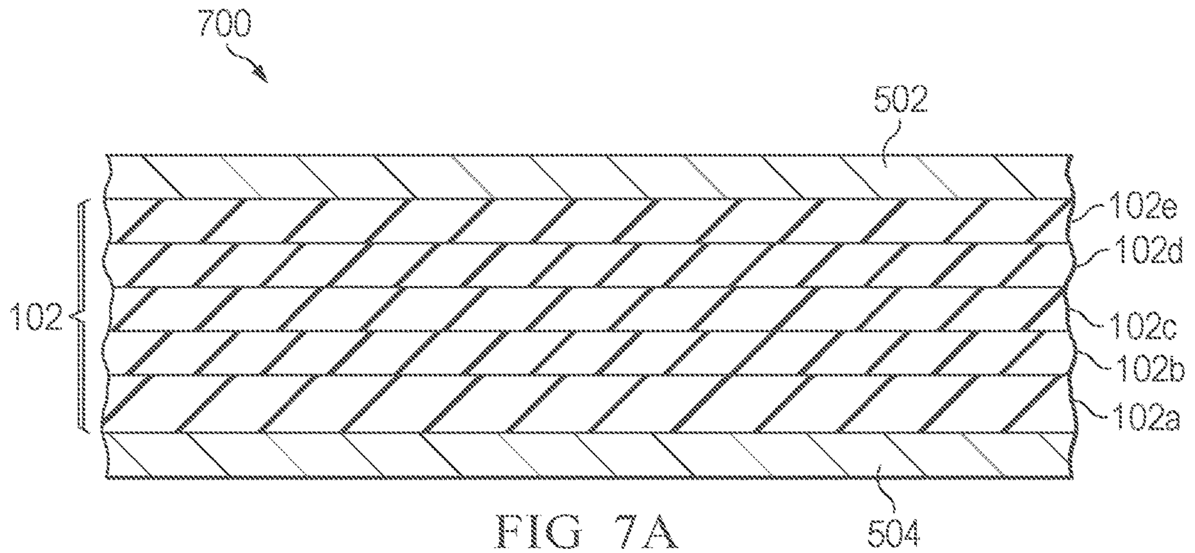
FIGS. 7A-7D are a series of cross-sectional side views showing an example method of forming an example starter core for use in any of the example embedded component substrates or IC packages disclosed herein.

FIGS. 7A-7D show a series of cross-sectional side views showing one example method of forming the example starter core 500 shown in shown in FIG. 5A and discussed above. As shown in FIG. 7A, a laminate structure 700 may be formed, including the first dielectric layer 102, first metal foil layer 502, and second metal foil layer 504. The dielectric layer first 102 may be formed as a laminated structure including multiple dielectric sub-layers 102*a*-102*e*. It should be understood that the first dielectric layer 102 may include any number of dielectric sub-layers. The first metal foil layer 502 (e.g., a first copper foil) may be formed on a first side of the first dielectric layer 102, and the second metal foil layer 504 (e.g., a second copper foil) may be formed on a second side of the first dielectric layer 102.

Figure 7B:
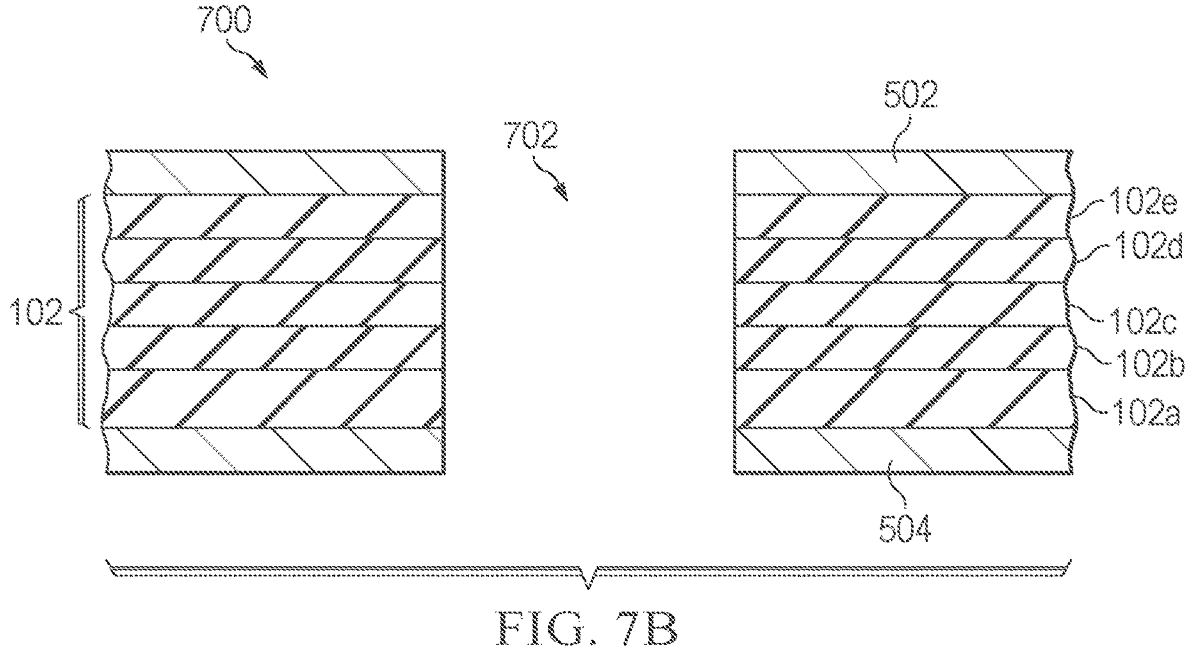

As shown in FIG. 7B, an opening 702 may be etched, machined, or otherwise formed in the laminate structure 600.

Figure 7C:
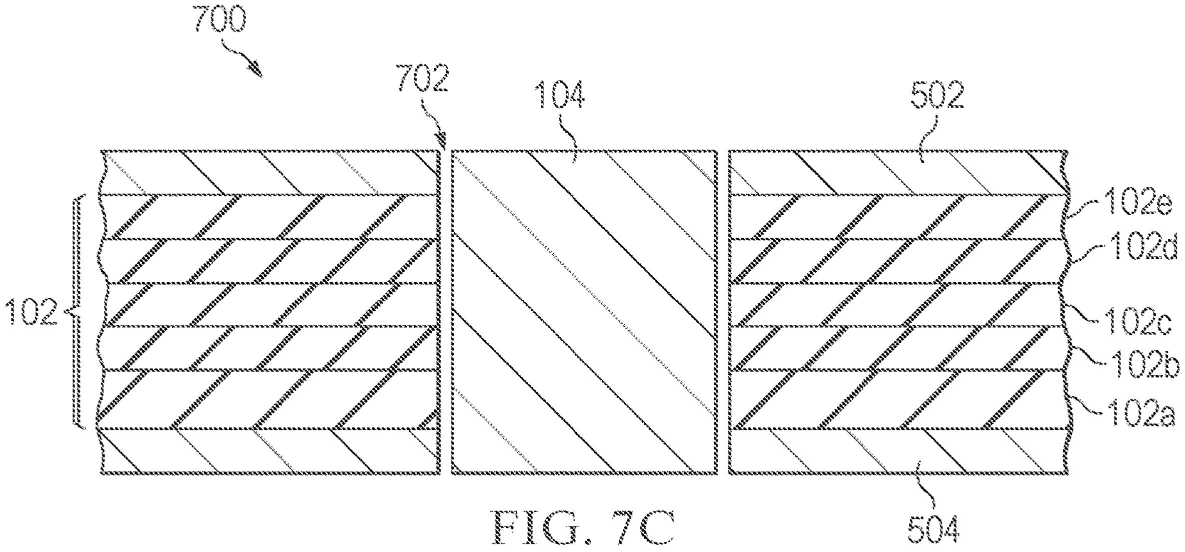

As shown in FIG. 7C, the conductive coin 104 (e.g., a solid copper mass) may be inserted in the opening 702 in the laminate structure 700.

Figure 7D:
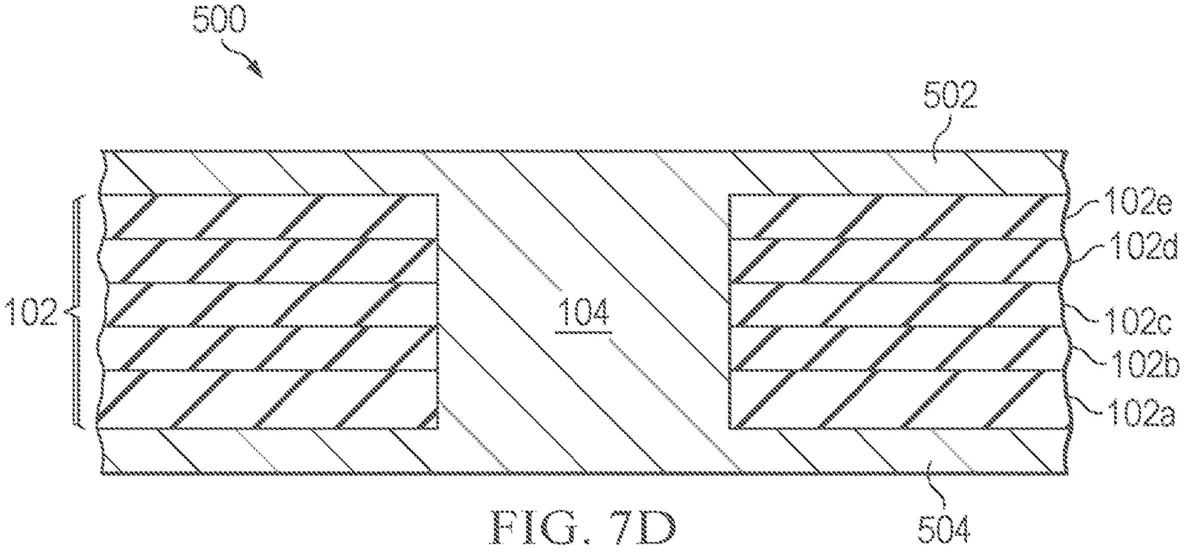

As shown in FIG. 7D, the laminated structure of the first dielectric layer 102 may be fully cured, e.g., causing one or more partially cured sub-layer(s) (e.g., one or more dielectric sub-layers 102*a*-102*e*) to flow around and encapsulate the conductive coin 104. The resulting structure may define the example starter core 500, which may be used for forming any of the example embedded component substrate and IC packages disclosed herein.

The invention claimed is:

1. A substrate, comprising:
a first dielectric layer;
a conductive coin embedded in the first dielectric layer;
a first conductive layer formed on a first side of the first dielectric layer;
a cavity in the first conductive layer, the cavity located over the conductive coin;
an embedded circuit component arranged in the cavity in the first conductive layer, wherein the embedded circuit component is located over the conductive coin and conductively coupled to the conductive coin;
a second dielectric layer formed over the first conductive layer;
a second conductive layer formed over the second dielectric layer; and
a via extending through the second dielectric layer, the via electrically connecting the second conductive layer to the embedded circuit component.

2. The substrate of claim 1, wherein the via comprises a micro-via having a vertical depth of less than 250 μm.

3. The substrate of claim 1, wherein:
the cavity in the first conductive layer extends through a full thickness of the first conductive layer; and
the embedded circuit component is mounted directly on the conductive coin.

4. The substrate of claim 1, wherein:
the cavity in the first conductive layer extends through a partial thickness of the first conductive layer, wherein the cavity defines a reduced thickness region of the first conductive layer over the conductive coin; and
the embedded circuit component is mounted on the reduced thickness region of the first conductive layer.

5. The substrate of claim 1, wherein a vertical offset between a top surface of the embedded circuit component and a top surface of the first conductive layer laterally outside the cavity is less than 50% of a vertical thickness of the first conductive layer laterally outside the cavity.

6. The substrate of claim 1, wherein a vertical offset between a top surface of the embedded circuit component and a top surface of the first conductive layer laterally outside the cavity is less than 25% of a vertical thickness of the first conductive layer laterally outside the cavity.

7. The substrate of claim 1, wherein a thickness of the second dielectric layer at a location laterally spaced apart from the embedded circuit component and the conductive coin is less than 250 microns.

8. The substrate of claim 7, wherein:

the via comprises a first micro-via having a vertical depth of less than 250 μm; and the substrate comprises a second micro-via at the location laterally spaced apart from the embedded circuit component and the conductive coin, the second micro-via extending through the second dielectric layer to electrically connect the second conductive layer to the first conductive layer.

9. The substrate of claim 1, comprising a third conductive layer formed on a second side of the first dielectric layer opposite the first side of the first dielectric layer, the third conductive layer contacting a second side of the conductive coin opposite the first side of the conductive coin;

wherein the conductive coin is sandwiched between the first conductive layer and the third conductive layer; and wherein the third conductive layer is electrically connected to the embedded circuit component through the conductive coin.

10. The substrate of claim 1, wherein the conductive coin comprises a solid metal mass.

11. The substrate of claim 1, wherein the conductive coin comprises a thermally conductive, electrically nonconductive component formed between a pair of metal components.

12. A substrate, comprising:

a first dielectric layer;

a conductive coin embedded in the first dielectric layer;

a first conductive layer formed on a first side of the first dielectric layer, the first conductive layer contacting a first side of the conductive coin;

an embedded circuit component mounted on the first conductive layer;

a second dielectric layer formed over the first conductive layer and covering the embedded circuit component;

a second conductive layer formed over the second dielectric layer and extending over the embedded circuit component; and a via electrically connecting the second conductive layer to the embedded circuit component.

13. The substrate of claim 12, wherein the via comprises a micro-via having a vertical depth of less than 250 μm.

14. The substrate of claim 12, comprising a third conductive layer formed on a second side of the first dielectric layer opposite the first side of the first dielectric layer, the third conductive layer contacting a second side of the conductive coin opposite the first side of the conductive coin;

wherein the conductive coin is sandwiched between the first conductive layer and the third conductive layer.

15. The substrate of claim 14, wherein the third conductive layer is electrically connected to the embedded circuit component through the conductive coin.

16. The substrate of claim 12, comprising a via extending through the second dielectric layer at a location spaced apart from the embedded circuit component, the via electrically connecting the second conductive layer to the first conductive layer.

17. The substrate of claim 12, wherein:

the first conductive layer includes a cavity extending through a partial thickness of the first conductive layer, wherein the cavity defines a reduced thickness region of the first conductive layer over the conductive coin; and the embedded circuit component is mounted on the reduced thickness region of the first conductive layer.

18. An integrated circuit (IC) package, comprising:

a substrate, comprising:

a first dielectric layer;

a conductive coin embedded in the first dielectric layer;

a first conductive layer formed on a first side of the first dielectric layer;

a cavity in the first conductive layer, the cavity located over the conductive coin;

an embedded circuit component arranged in the cavity in the first conductive layer, wherein the embedded circuit component is located over the conductive coin and conductively coupled to the conductive coin;

a second dielectric layer formed over the first conductive layer;

a second conductive layer formed over the second dielectric layer; and a via extending through the second dielectric layer, the via electrically connecting the second conductive layer to the embedded circuit component; and an electronic device mounted on a first side of the substrate, wherein the electronic device is electrically connected to a first respective element of the embedded circuit component through the via.

19. The IC package of claim 18, wherein the via comprises a micro-via having a vertical depth of less than 250 μm.

20. The IC package of claim 18, wherein the electronic device is electrically connected to a second respective element of the embedded circuit component through the conductive coin.

21. The IC package of claim 18, comprising a heat sink mounted on a second side of the substrate opposite the first side of the substrate, wherein the heat sink is thermally coupled to the embedded circuit component through the conductive coin.

22. A method of forming a substrate, the method comprising:

forming a first dielectric layer including a coin opening;

embedding a conductive coin in the coin opening in the first dielectric layer;

forming a first conductive layer on a first side of the first dielectric layer, the first conductive layer including a cavity located over the conductive coin;

mounting an embedded circuit component in the cavity in the first conductive layer, wherein the mounted embedded circuit component is conductively coupled to the conductive coin;

forming a second dielectric layer over the first conductive layer;

forming a second conductive layer over the second dielectric layer; and forming a via extending through the second dielectric layer, the via electrically connecting the second conductive layer to the embedded circuit component.

23. The method of claim 22, wherein forming the via comprises forming a micro-via having a vertical depth of less than 250 μm.

24. The method of claim 22, wherein forming the first dielectric layer including the coin opening and embedding the conductive coin in the coin opening in the first dielectric layer comprises:

forming a core structure including the first dielectric layer and a metal foil formed on the first dielectric layer, wherein the first dielectric layer includes multiple dielectric sub-layers including at least one partially cured dielectric sub-layer;

forming the coin opening in the core structure;

mounting the conductive coin in the coin opening; and curing the at least one partially cured dielectric layer to embed the conductive coin in the core structure.

25. The method of claim 22, wherein forming the first conductive layer including the cavity located over the conductive coin comprises:

forming the first conductive layer; and etching the cavity in the first conductive layer, the cavity extending through a partial depth or a full depth of the first conductive layer.

26. The method of claim 22, wherein a vertical offset between a top surface of the embedded circuit component and a top surface of the first conductive layer is less than 50% of a vertical thickness of the first conductive layer.

27. The method of claim 22, wherein a vertical offset between a top surface of the embedded circuit component and a top surface of the first conductive layer is less than 25% of a vertical thickness of the first conductive layer.

28. The method of claim 22, wherein forming the via comprises forming a first micro-via having a vertical depth of less than 250 μm; and the method comprises forming a second micro-via at the location laterally spaced apart from the embedded circuit component and the conductive coin, the second micro-via extending through the second dielectric layer to electrically connect the second conductive layer to the first conductive layer.

* * * * *